(12) United States Patent
Lee et al.

(10) Patent No.: US 9,548,403 B2
(45) Date of Patent: Jan. 17, 2017

(54) SOLAR CELL AND METHOD FOR MANUFACTURING THE SAME

(71) Applicant: LG Electronics Inc., Seoul (KR)

(72) Inventors: Younghyun Lee, Seoul (KR); Heejin Nam, Seoul (KR); Yoonsil Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/057,832

(22) Filed: Mar. 1, 2016

(65) Prior Publication Data

US 2016/0181443 A1 Jun. 23, 2016

Related U.S. Application Data

(63) Continuation of application No. 13/653,034, filed on Oct. 16, 2012, now Pat. No. 9,306,086.

(30) Foreign Application Priority Data

Feb. 23, 2012 (KR) .......................... 10-2012-0018329

(51) Int. Cl.
*H01L 31/0224* (2006.01)
*H01L 31/02* (2006.01)
(Continued)

(52) U.S. Cl.
CPC ..... *H01L 31/0201* (2013.01); *H01L 31/02168* (2013.01); *H01L 31/022425* (2013.01);
(Continued)

(58) Field of Classification Search
CPC ................ H01L 31/022425; H01L 31/022433; H01L 31/1864; H01L 31/1868; Y02E 10/50
See application file for complete search history.

(56) References Cited

U.S. PATENT DOCUMENTS 5,011,565 A * 4/1991 Dube ................ H01L 31/02242
136/256
5,116,427 A 5/1992 Fan et al.
(Continued)

FOREIGN PATENT DOCUMENTS

CN 1554113 A 12/2004
CN 102077359 A 5/2011
(Continued)

*Primary Examiner* — Earl Taylor
(74) *Attorney, Agent, or Firm* — Birch, Stewart, Kolasch & Birch, LLP

(57) ABSTRACT

A solar cell according to an embodiment of the invention includes a substrate of a first conductive type, an emitter region of a second conductive type opposite the first conductive type, which is positioned at the substrate, an anti-reflection layer including a first opening exposing the emitter region and a plurality of second openings which expose the emitter region and are separated from one another, a first electrode which is positioned on a first portion of the emitter region exposed through the first opening and is connected to the first portion, a first bus bar which is positioned on a second portion of the emitter region exposed through the plurality of second openings and is connected to the second portion and the first electrode, and a second electrode which is positioned on the substrate and is connected to the substrate.

25 Claims, 13 Drawing Sheets

(51) Int. Cl.
*H01L 31/18* (2006.01)
*H01L 31/0216* (2014.01)
*H01L 31/048* (2014.01)

(52) U.S. Cl.
CPC .... *H01L 31/022433* (2013.01); *H01L 31/048* (2013.01); *H01L 31/186* (2013.01); *Y02E 10/50* (2013.01); *Y02E 10/547* (2013.01)

(56) References Cited

U.S. PATENT DOCUMENTS

| | | | | |
|---|---|---|---|---|
| 6,524,880 | B2* | 2/2003 | Moon | H01L 31/02242 136/249 |
| 7,820,532 | B2* | 10/2010 | Leung | H01L 21/2225 257/E21.077 |
| 7,884,375 | B2* | 2/2011 | Park | H01L 31/02242 257/414 |
| 8,309,446 | B2* | 11/2012 | Weidman | H01L 21/67155 257/E21.144 |
| 8,614,115 | B2* | 12/2013 | Clevenger | H01L 31/02242 438/537 |
| 8,680,490 | B2* | 3/2014 | Kwag | H01L 31/068 250/492.21 |
| 8,927,313 | B2* | 1/2015 | Lee | H01L 31/068 438/548 |
| 8,969,125 | B2* | 3/2015 | Lee | H01L 31/02167 438/71 |
| 9,000,291 | B2* | 4/2015 | Lee | H01L 31/02242 136/256 |
| 9,040,813 | B2* | 5/2015 | Kim | H01L 31/02242 136/244 |
| 9,087,934 | B2* | 7/2015 | Lee | H01L 31/02168 |
| 9,306,086 | B2* | 4/2016 | Lee | H01L 31/02242 |
| 2002/0153039 | A1* | 10/2002 | Moon | H01L 31/02242 136/256 |
| 2003/0178057 | A1* | 9/2003 | Fujii | H01L 31/02242 136/256 |
| 2005/0227483 | A1 | 10/2005 | Basol et al. | |
| 2006/0107991 | A1* | 5/2006 | Baba | H01L 31/0547 136/244 |
| 2007/0290283 | A1* | 12/2007 | Park | H01L 31/02242 257/431 |
| 2008/0092944 | A1* | 4/2008 | Rubin | H01L 31/02242 136/252 |
| 2009/0007962 | A1 | 1/2009 | Wenham et al. | |
| 2010/0024880 | A1* | 2/2010 | Lee | H01L 31/02167 136/256 |
| 2010/0037952 | A1* | 2/2010 | Lin | H01L 31/02242 136/256 |
| 2010/0224228 | A1* | 9/2010 | Kim | H01L 31/02242 136/244 |
| 2010/0319770 | A1* | 12/2010 | Lee | H01L 31/02242 136/256 |
| 2011/0003424 | A1* | 1/2011 | De Ceuster | H01L 31/02243 438/71 |
| 2011/0056551 | A1* | 3/2011 | Kim | H01L 31/02242 136/256 |
| 2011/0132426 | A1* | 6/2011 | Kang | H01L 31/02245 136/244 |
| 2011/0139229 | A1* | 6/2011 | Rohatgi | H01L 21/263 136/255 |
| 2011/0139230 | A1* | 6/2011 | Rohatgi | H01L 21/263 136/255 |
| 2011/0139231 | A1* | 6/2011 | Meier | H01L 31/02363 136/255 |
| 2011/0139236 | A1* | 6/2011 | Lee | H01L 31/0236 136/256 |
| 2011/0139239 | A1* | 6/2011 | Lee | H01L 31/02243 136/256 |
| 2011/0140226 | A1* | 6/2011 | Jin | H01L 31/02168 257/460 |
| 2011/0143486 | A1* | 6/2011 | Hama | H01L 31/02242 438/72 |
| 2011/0197964 | A1 | 8/2011 | Jang et al. | |
| 2011/0240339 | A1 | 10/2011 | Wang et al. | |
| 2011/0253209 | A1 | 10/2011 | You | |
| 2011/0253210 | A1* | 10/2011 | Lee | H01L 31/02363 136/256 |
| 2012/0048362 | A1* | 3/2012 | Lee | H01L 31/02168 136/256 |
| 2012/0055538 | A1* | 3/2012 | Lee | H01L 31/02168 136/246 |
| 2012/0174975 | A1* | 7/2012 | Shin | H01L 31/02243 136/256 |
| 2012/0180860 | A1* | 7/2012 | Ko | H01L 31/02168 136/256 |
| 2012/0260974 | A1* | 10/2012 | Brecht | C03B 23/025 136/251 |
| 2013/0025665 | A1* | 1/2013 | Lee | H01L 31/02168 136/256 |
| 2013/0109133 | A1* | 5/2013 | Frei | H01L 31/18 438/98 |
| 2013/0118571 | A1* | 5/2013 | Shim | H01L 31/02363 136/256 |
| 2013/0186457 | A1* | 7/2013 | Kwag | H01L 31/068 136/255 |
| 2013/0220400 | A1* | 8/2013 | Kim | H01L 31/02242 136/246 |
| 2013/0220411 | A1* | 8/2013 | Lee | H01L 31/02242 136/256 |
| 2013/0255777 | A1* | 10/2013 | Lee | H01L 31/02167 136/259 |

FOREIGN PATENT DOCUMENTS

| | | | | |
|---|---|---|---|---|
| EP | 2631953 A2 | * | 8/2013 | ..... H01L 31/022425 |
| EP | 2639834 A2 | * | 9/2013 | ..... H01L 31/022425 |
| EP | 2631953 A3 | * | 12/2013 | ..... H01L 31/022425 |
| EP | 2639834 A3 | * | 3/2014 | ..... H01L 31/022425 |
| JP | 2-123770 A | | 5/1990 | |
| JP | 4-504033 A | | 7/1992 | |
| JP | 2010027778 A | * | 2/2010 | |
| JP | 2010-135562 A | | 6/2010 | |
| JP | 2011-512041 A | | 4/2011 | |
| JP | 2013175703 A | * | 9/2013 | |
| KR | 20130096823 A | * | 9/2013 | ..... H01L 31/022425 |
| WO | WO 03/009361 A2 | | 1/2003 | |
| WO | WO 2010/126570 A2 | | 11/2010 | |

\* cited by examiner

SOLAR CELL AND METHOD FOR MANUFACTURING THE SAME

This application is a Continuation of co-pending U.S. application Ser. No. 13/653,034 filed on Oct. 16, 2012, which claims priority to and the benefit of Korean Patent Application No. 10-2012-0018329, filed in the Korean Intellectual Property Office on Feb. 23, 2012, the entire contents of which are incorporated herein by reference.

BACKGROUND OF THE INVENTION

Field of the Invention

Embodiments of the invention relate to a solar cell and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type, and thus, form a p-n junction, and electrodes respectively connected to the semiconductor parts of the different conductive types.

When light is incident on the solar cell, electrons and holes are produced in the semiconductor parts. The electrons move to the n-type semiconductor part, and the holes move to the p-type semiconductor part under the influence of the p-n junction of the semiconductor parts. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a substrate of a first conductive type, an emitter region of a second conductive type opposite the first conductive type, which is positioned at the substrate, an anti-reflection layer including a first opening, which is positioned on the emitter region and exposes the emitter region, and a plurality of second openings which expose the emitter region and are separated from one another, a first electrode which is positioned on a first portion of the emitter region exposed through the first opening and is connected to the first portion of the emitter region, a first bus bar which is positioned on a second portion of the emitter region exposed through the plurality of second openings and is connected to the second portion of the emitter region and the first electrode, and a second electrode which is positioned on the substrate and is connected to the substrate.

The number of the plurality of second openings may be 30 to 70.

A ratio of a width of a bus bar formation area of the anti-reflection layer to a total width of the plurality of second openings underlying the first bus bar may be about 1:0.2 to 1:0.5.

The plurality of second openings may be separated from one another at uniform intervals.

The plurality of second openings may be separated from one another at different intervals.

The anti-reflection layer may include a bus bar formation area, in which the plurality of second openings are formed. The first bus bar may be positioned in the bus bar formation area of the anti-reflection layer. A distance between two adjacent second openings positioned in a middle of the bus bar formation area may be greater than a distance between the two adjacent second openings positioned at an edge of the bus bar formation area.

The distance between the two adjacent second openings positioned in a middle of the bus bar formation area may be about 1.5 times to 5 times the distance between the two adjacent second openings positioned at the edge of the bus bar formation area.

A distance between the two adjacent second openings may be about 15 μm to 30 μm.

The first bus bar may be additionally positioned on the anti-reflection layer positioned between the plurality of second openings.

An upper surface of the first bus bar may be a curved surface.

A height of the first bus bar positioned on the anti-reflection layer may be less than a height of the first bus bar positioned on the second portion of the emitter region exposed through the plurality of second openings.

A height of an edge of the first bus bar may be greater than a height of a middle portion of the first bus bar.

The first opening may extend under the first electrode in a first direction. Each of the plurality of second openings may extend under the first bus bar in a second direction crossing the first direction.

A lateral surface of at least one of the first and second openings may be an even surface or an uneven surface.

The emitter region may include a first emitter region having a first sheet resistance and a second emitter region having a second sheet resistance less than the first sheet resistance.

The second emitter region may be positioned in the first portion of the emitter region exposed through the first opening and the second portion of the emitter region exposed through the plurality of second openings.

A width of the second emitter region may be substantially equal to a width of the first opening and a width of each of the plurality of second openings.

A width of the second emitter region formed in the first portion of the emitter region exposed through the first opening may be less than a width of the first electrode.

The anti-reflection layer may include a bus bar formation area, in which the plurality of second openings are formed. The first bus bar may be positioned in the bus bar formation area of the anti-reflection layer. A width of the first bus bar may be greater than a width of the bus bar formation area.

The solar cell may further include a surface field region of the first conductive type, which is positioned at the substrate underlying the second electrode and is connected to the substrate.

The solar cell may further include a passivation layer, which is positioned on the surface field region and includes a third opening exposing a first portion of the surface field region. The second electrode may be positioned on the first portion of the surface field region exposed through the third opening and is connected to the surface field region.

The passivation layer may further include a plurality of fourth openings, which are positioned to be separated from a second portion of the surface field region different from the first portion of the surface field region. The solar cell may further include a second bus bar, which is positioned on the second portion of the surface field region exposed through the plurality of fourth openings and is connected to the second electrode.

The number of the plurality of fourth openings may be 30 to 70.

A ratio of a width of a bus bar formation area of the passivation layer to a total width of the plurality of fourth openings underlying the second bus bar may be about 1:0.2 to 1:0.5.

The plurality of fourth openings may be separated from one another at different intervals. The second bus bar may be additionally positioned on the passivation layer between the plurality of fourth openings.

In another aspect, there is a method for manufacturing a solar cell including doping impurities of a first conductive type or impurities of a second conductive type opposite the first conductive type on a first surface of a semiconductor substrate of the first conductive type to form an impurity region, forming a passivation layer on the impurity region, selectively irradiating a laser beam onto the passivation layer to form a first opening exposing a first portion of the impurity region and a plurality of second openings, which are separated from the first opening and expose a second portion of the impurity region, in the passivation layer, and forming an electrode on the first portion of the impurity region exposed through the first opening and forming a bus bar on the second portion of the impurity region exposed through the plurality of second openings, the bus bar being connected to the electrode.

A width of the first opening may be substantially equal to a width of each of the plurality of second openings.

The plurality of second openings may be separated from one another at uniform intervals.

The plurality of second openings may be separated from one another at different intervals.

A distance between the two adjacent second openings may be about 15 μm to 30 μm.

The electrode and the bus bar may be simultaneously formed using a plating method.

The method may further include forming an impurity layer of the same conductive type as the impurity region on the passivation layer. The laser beam may be selectively irradiated onto the impurity layer. Hence, a portion of the impurity region underlying the passivation layer may become a first impurity region having a first sheet resistance. The first and second portions of the impurity region exposed through the first opening and the plurality of second openings may become a second impurity region having a second sheet resistance less than the first sheet resistance.

According to the above characteristics, because the plurality of second openings are locally positioned under the first bus bar, a formation area of the plurality of second openings decreases. Thus, time required to form the plurality of second openings is reduced, and an exposed area of the substrate exposed to the laser beam for forming the plurality of second openings decreases. Hence, the degradation of the substrate is prevented or reduced. As a result, time required to manufacture the solar cell is reduced, and changes in characteristics of the substrate are prevented or reduced.

Furthermore, because the first electrode is formed using the plating method, a width of the first electrode decreases. Hence, an amount of light incident on the substrate increases, and the efficiency of the solar cell is improved.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
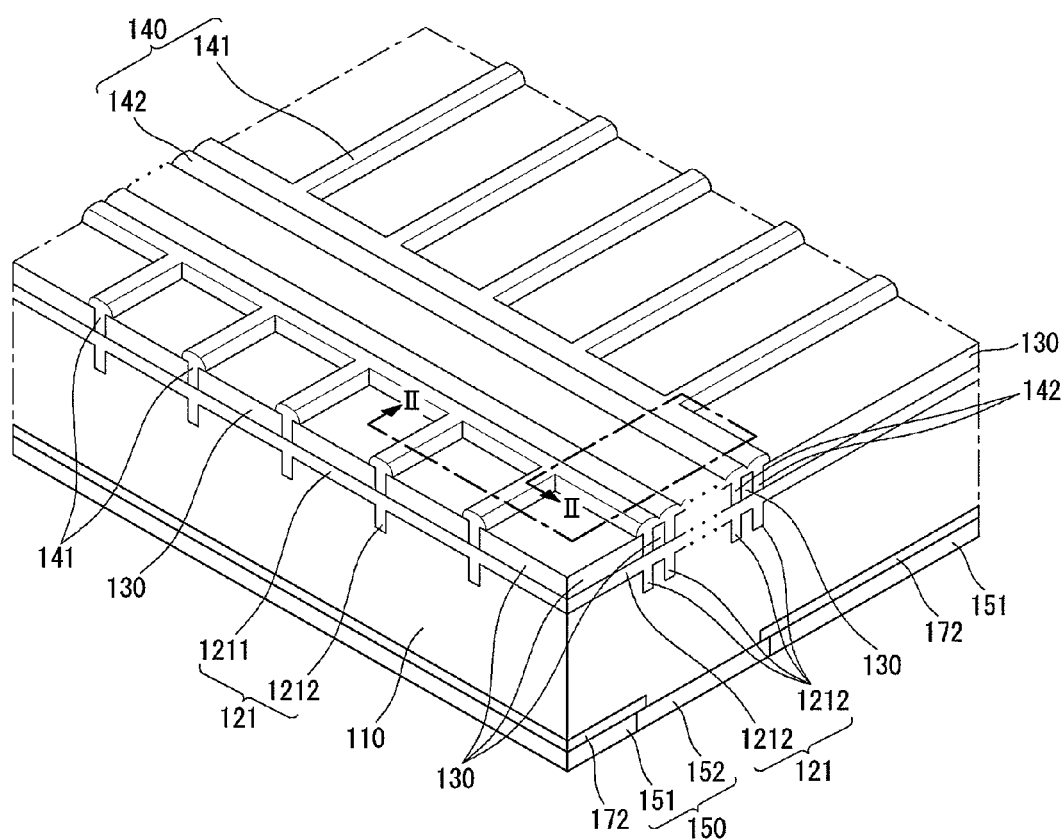
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Example embodiments of the invention will be described with reference to FIGS. 1 to 11.

A solar cell according to an example embodiment of the invention is described in detail with reference to FIGS. 1 to 3.

Figure 2:
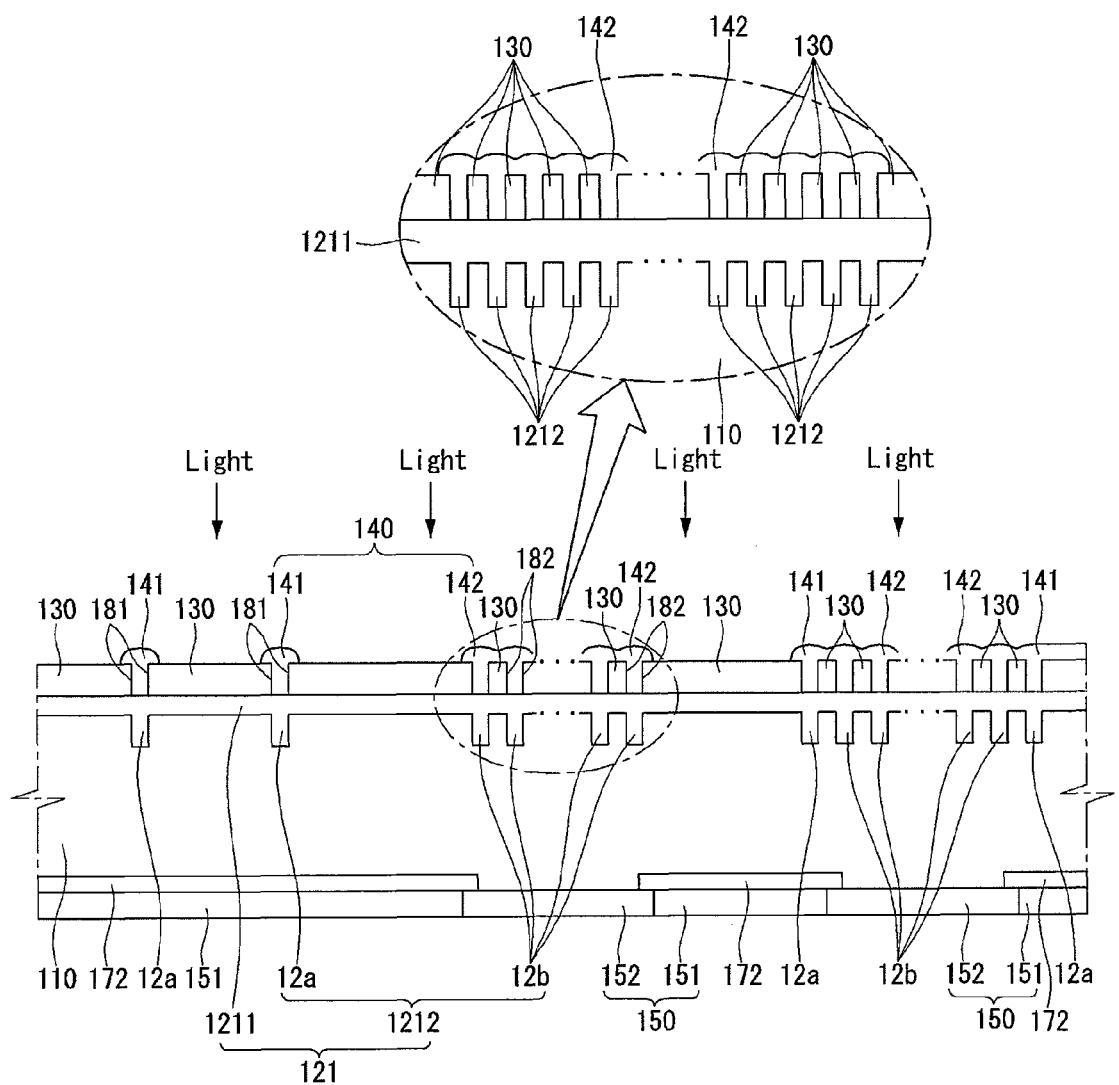
FIG. 2 is a cross-sectional view taken along line II-II of FIG. 1.

As shown in FIGS. 1 and 2, a solar cell according to an example embodiment of the invention includes a substrate 110, an emitter region 121 positioned at a front surface (or a first surface) of the substrate 110, on which light is incident, an anti-reflection layer 130 positioned on the emitter region 121, a front electrode part (or a first electrode part) 140 which is positioned on the front surface of the substrate 110 and includes a plurality of front electrodes (or a plurality of first electrodes) 141 and a plurality of front bus bars (or a plurality of first bus bars) 142 connected to the plurality of front electrodes 141, a plurality of surface field regions 172 positioned at a back surface (or a second surface) opposite the front surface of the substrate 110, and a back electrode part (or a second electrode part) 150 which is positioned on the surface field regions 172 and the back surface of the substrate 110 and includes a back electrode (or a second electrode) 151 and a plurality of back bus bars (or a plurality of second bus bars) 152 connected to the back electrode 151.

The substrate 110 is a semiconductor substrate formed of a semiconductor such as first conductive type silicon, for example, p-type silicon, though not required. The semiconductor used in the substrate 110 is a crystalline semiconductor, such as single crystal silicon and polycrystalline silicon.

When the substrate 110 is of a p-type, the substrate 110 is doped with impurities of a group III element such as boron (B), gallium (Ga), and indium (In). Alternatively, the substrate 110 may be of an n-type and/or may be formed of a semiconductor material other than silicon. If the substrate 110 is of the n-type, the substrate 110 may be doped with impurities of a group V element such as phosphorus (P), arsenic (As), and antimony (Sb).

The entire surface of the substrate 110 may be textured to form a textured surface corresponding to an uneven surface having a plurality of protrusions and a plurality of depressions or having uneven characteristics. In this instance, a surface area of the substrate 110 may increase because of the textured surface of the substrate 110, and thus, an incidence area of light may increase. Further, because an amount of light reflected by the substrate 110 may decrease, an amount of light incident on the substrate 110 may increase.

The emitter region 121 is an impurity doped region doped with impurities of a second conductive type (for example, n-type) opposite the first conductive type (for example, p-type) of the substrate 110. The emitter region 121 is positioned at the front surface of the substrate 110. Thus, the emitter region 121 of the second conductive type forms a p-n junction along with a first conductive type region of the substrate 110.

The emitter region 121 includes a first emitter region (or a first impurity doped region) 1211 and a second emitter region (or a second impurity doped region) 1212 each having a different impurity doping thickness and a different sheet resistance.

In the embodiment of the invention, an impurity doping thickness (or depth) of the first emitter region 1211 is less than an impurity doping thickness (or depth) of the second emitter region 1212. Thus, an impurity doping concentration of the first emitter region 1211 is less than an impurity doping concentration of the second emitter region 1212. Further, a sheet resistance of the first emitter region 1211 is greater than a sheet resistance of the second emitter region 1212. For example, the sheet resistance of the first emitter region 1211 may be about 80 $\Omega$/sq. to 120 $\Omega$/sq., and the sheet resistance of the second emitter region 1212 may be about 10 $\Omega$/sq. to 50 $\Omega$/sq.

In other words, the emitter region 121 according to the embodiment of the invention has a selective emitter structure including the first and second emitter regions 1211 and 1212 each having the different impurity doping thickness and the different sheet resistance.

A p-n junction surface (hereinafter, referred to as "a first junction surface") between the first emitter region 1211 and the substrate 110 (i.e., the first conductive type region of the substrate 110) and a p-n junction surface (hereinafter, referred to as "a second junction surface") between the second emitter region 1212 and the substrate 110 are positioned at different height levels. Thus, a thickness (or a distance) between the back surface of the substrate 110 and the first junction surface is greater than a thickness between the back surface of the substrate 110 and the second junction surface.

Figure 3:
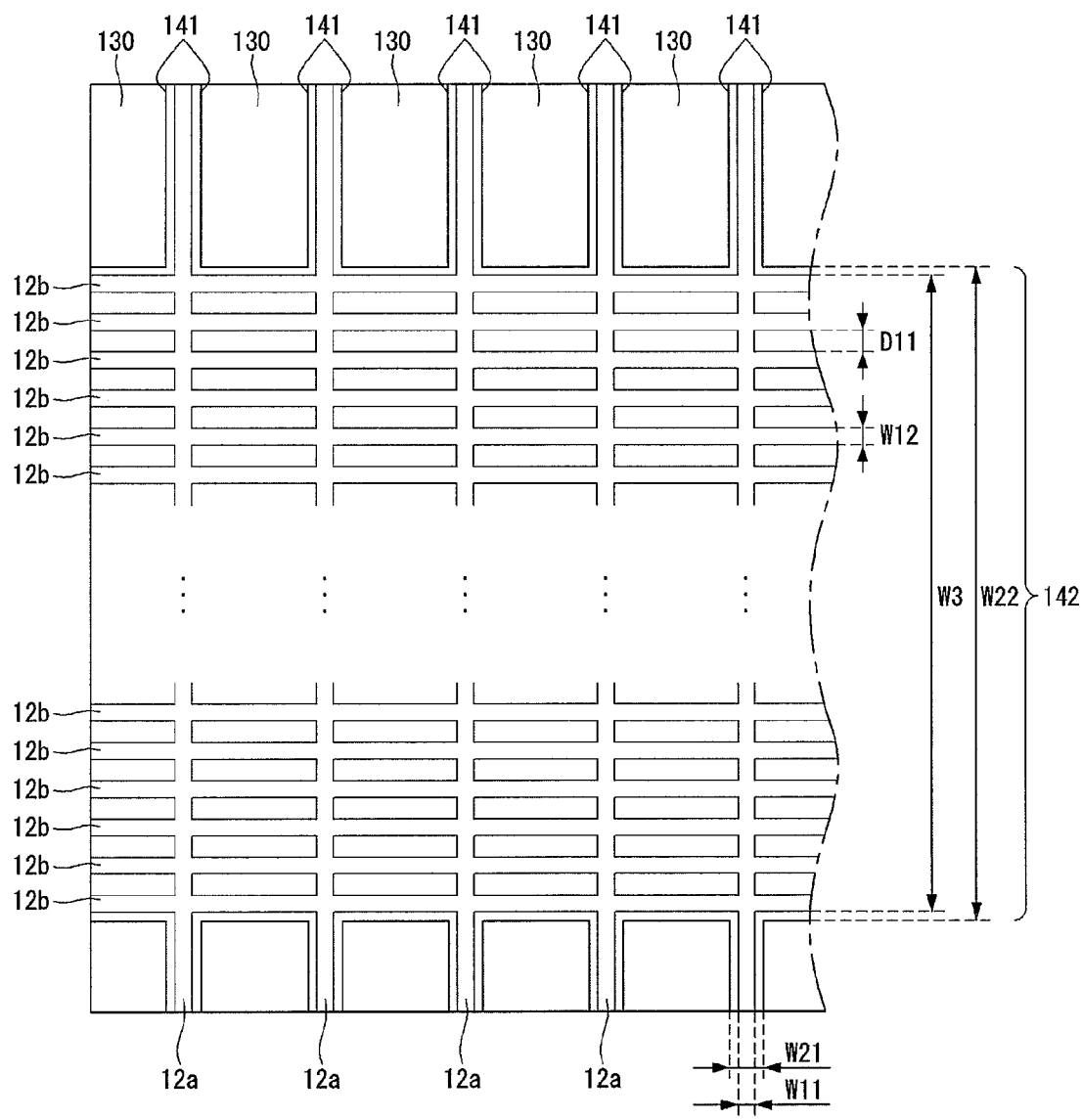
FIGS. 3 and 4 are plane views schematically illustrating a portion of a front electrode part of a solar cell according to an example embodiment of the invention and a portion of an emitter region underlying the front electrode part.

As shown in FIGS. 1 to 3, the first emitter region 1211 is positioned under the anti-reflection layer 130, and the second emitter region 1212 is positioned under the front electrodes 141 and the front bus bars 142. The second emitter region 1212 includes a plurality of electrode emitter regions 12a (or a first portion of the emitter region) respectively positioned under the front electrodes 141 and a plurality of bus bar emitter regions 12b (or a second portion of the emitter region) respectively positioned under the front bus bars 142.

A width W11 of each of the electrode emitter regions 12a is substantially equal to a width W12 of each of the bus bar emitter regions 12b. For example, the width W11 of the electrode emitter region 12a and the width W12 of the bus bar emitter region 12b may be about 5 µm to 15 µm.

As shown in FIG. 3, the electrode emitter region 12a underlying the front electrode 141 extends along the front electrode 141 in the same direction as the front electrode 141. Thus, the electrode emitter regions 12a are respectively positioned under the front electrodes 141.

The bus bar emitter region 12b underlying the front bus bar 142 extends along the front bus bar 142 in the same direction as the front bus bar 142. Further, the bus bar emitter regions 12b are separated from each other, and the first emitter region 1211 exists between the adjacent bus bar emitter regions 12b.

As shown in FIG. 3, because an extension direction of the front electrodes 141 and an extension direction of the front bus bars 142 cross each other, the front electrodes 141 and the front bus bars 142 are connected to each other at crossings of the front electrodes 141 and the front bus bars 142. Thus, the electrode emitter regions 12a and the bus bar emitter regions 12b, which are positioned under the front electrodes 141 and the front bus bars 142, and which extend in the same direction as the front electrodes 141 and the front bus bars 142, are connected to each other at crossings of the electrode emitter regions 12a and the bus bar emitter regions 12b.

Accordingly, the plurality of second emitter regions 1212 (i.e., the separated bus bar emitter regions 12b) are positioned under each front bus bar 142, except the crossings of the front electrodes 141 and the front bus bars 142. A distance D11 between the two adjacent bus bar emitter regions 12b may be about 15 µm to 30 µm.

As shown in FIGS. 1 to 3, in the embodiment of the invention, the plurality of second emitter regions 1212 (i.e., the plurality of bus bar emitter regions 12b) underlying each front bus bar 142 are separated from one another at uniform intervals D11.

Figure 4:
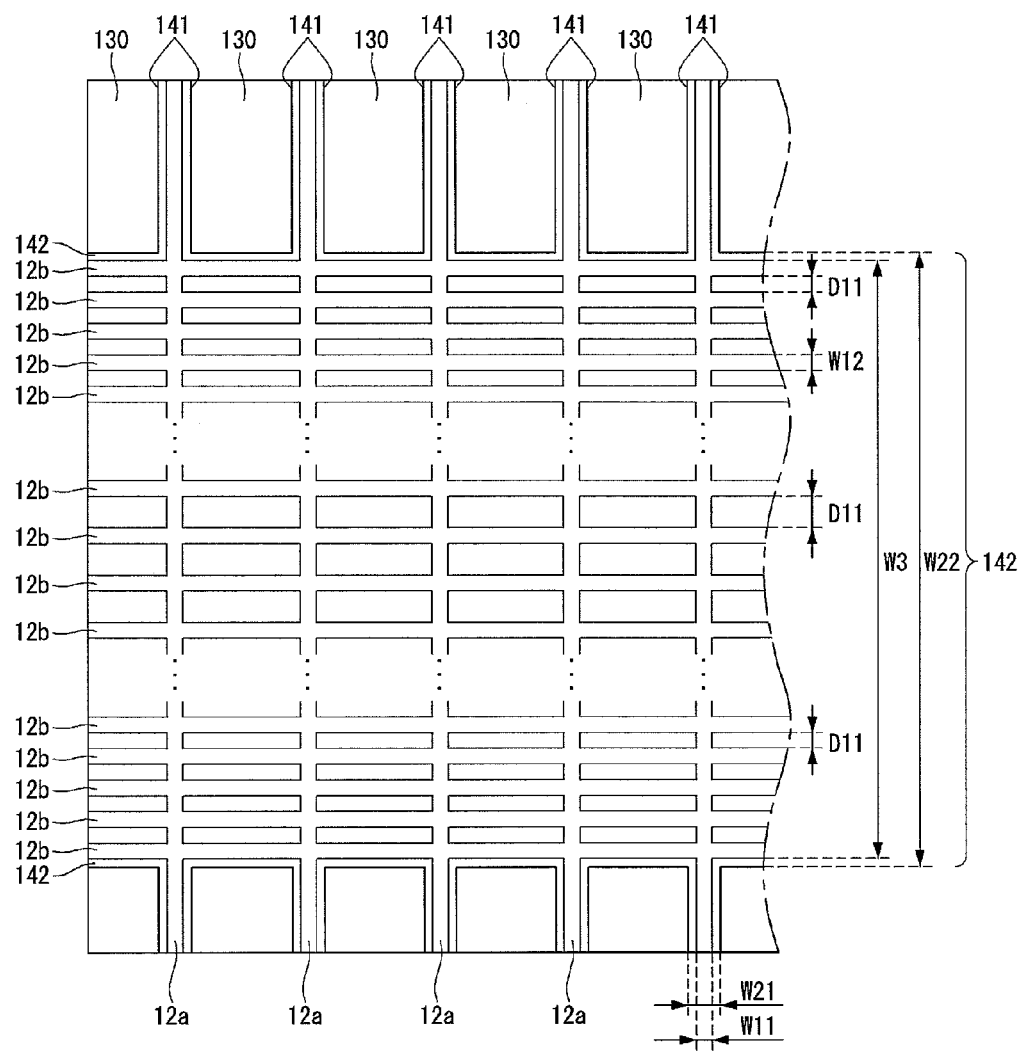

Alternatively, as shown in FIG. 4, the plurality of second emitter regions 1212 (i.e., the plurality of bus bar emitter regions 12b) underlying each front bus bar 142 may be separated from one another at different intervals (or distances) D11.

For example, as shown in FIG. 4, in the different distances D11 between the bus bar emitter regions 12b, the distance D11 positioned in the middle of a formation width W3 of the plurality of bus bar emitter regions 12b corresponding to each front bus bar 142 may be greater than the distance D11 positioned at an edge of the formation width W3. Yet, in this instance, a plurality of distances D11 positioned in the middle of the formation width W3 may be substantially equal to one another, and a plurality of distances D11 positioned at the edge of the formation width W3 may be substantially equal to one another.

The distance D11 between the bus bar emitter regions 12b positioned in the middle of the formation width W3 may be about 1.5 times to 5 times the distance D11 between the bus bar emitter regions 12b positioned at the edge of the formation width W3.

Alternatively, distances D11 between the bus bar emitter regions 12b may be different from one another irrespective of a location of the formation width W3 of the plurality of bus bar emitter regions 12b.

In the embodiment of the invention, the number of second emitter regions 1212 (i.e., the bus bar emitter regions 12b) underlying each front bus bar 142 is determined depending on a width of each second emitter region 1212, the distance D11 between the two adjacent bus bar emitter regions 12b, and a width of each bus bar emitter region 12b. For example, the number may be about 30 to 70.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the p-type and the emitter region 121 is of the n-type, the electrons move to the emitter region 121, and the holes move to the back surface of the substrate 110.

Because the emitter region 121 forms the p-n junction along with the substrate 110, the emitter region 121 may be of the p-type when the substrate 110 is of the n-type in contrast to the embodiment described above. In this instance, the electrons move to the back surface of the substrate 110, and the holes move to the emitter region 121.

Returning to the embodiment of the invention, when the emitter region 121 is of the n-type, the emitter region 121 may be doped with impurities of a group V element such as P, As, and Sb. On the contrary, when the emitter region 121 is of the p-type, the emitter region 121 may be doped with impurities of a group III element such as B, Ga, and In.

When the sheet resistance of the first emitter region 1211 is about 80 Ω/sq. to 120 Ω/sq., an amount of light absorbed in the first emitter region 1211 decreases, and an amount of light incident on the substrate 110 increases. Hence, a loss amount of carriers resulting from impurities is reduced.

Further, when the sheet resistance of the second emitter region 1212 is about 10 Ω/sq. to 50 Ω/sq., a contact resistance between the second emitter region 1212 and the front electrode part 140 decreases. Hence, a loss amount of carriers resulting from the contact resistance from movements of carriers is reduced.

As described above, because the first emitter region 1211 of the emitter region 121 is positioned under the anti-reflection layer 130, the anti-reflection layer 130 is positioned on the first emitter region 1211. Thus, because the first emitter region 1211 exists between the two adjacent bus bar emitter regions 12b among the plurality of bus bar emitter regions 12b underlying each front bus bar 142, the anti-reflection layer 130 is positioned on the first emitter region 1211 between the two adjacent bus bar emitter regions 12b.

The anti-reflection layer 130 may be formed of hydrogenated silicon nitride (SiNx:H), hydrogenated silicon oxide (SiOx:H), hydrogenated silicon oxynitride (SiOxNy:H), or aluminum oxide (AlxOy), etc. Other materials may be used.

The anti-reflection layer 130 reduces a reflectance of light incident on the solar cell and increases selectivity of a predetermined wavelength band, thereby increasing the efficiency of the solar cell.

The anti-reflection layer 130 performs a passivation function, which converts a defect, for example, dangling bonds existing at and around the surface of the substrate 110 into stable bonds using hydrogen (H) or oxygen ($O_2$) contained in the anti-reflection layer 130 to thereby prevent or reduce a recombination and/or a disappearance of carriers moving to the surface of the substrate 110. Thus, the anti-reflection layer 130 serves as a passivation layer. The anti-reflection layer 130 reduces an amount of carriers lost by the defect at and around the surface of the substrate 110 to thereby improve the efficiency of the solar cell.

In the embodiment of the invention, the anti-reflection layer 130 has a single-layered structure, but in other embodiments of the invention, the anti-reflection layer 130 may have a multi-layered structure, for example, a double-layered structure. The anti-reflection layer 130 may be omitted, if desired.

The front electrode part 140 including the front electrodes 141 and the front bus bars 142 is positioned on the emitter region 121 and the anti-reflection layer 130 and also is connected to the second emitter region 1212 of the emitter region 121.

The front electrodes 141 are separated from one another and extend parallel to one another in a fixed direction. The front electrodes 141 are electrically and physically connected to the electrode emitter regions 12a of the second emitter region 1212.

The anti-reflection layer 130 is partially (or locally) removed, and thus, includes a plurality of first openings 181 exposing the electrode emitter regions 12a underlying a removed portion of the anti-reflection layer 130, so as to respectively connect the front electrodes 141 to the electrode emitter regions 12a of the second emitter region 1212. Further, the anti-reflection layer 130 is partially (or locally) removed, and thus, includes a plurality of second openings 182 exposing the bus bar emitter regions 12b underlying a removed portion of the anti-reflection layer 130, so as to connect each front bus bar 142 to the bus bar emitter regions 12b of the second emitter region 1212.

The plurality of first and second openings 181 and 182 may be formed by irradiating a laser beam onto a corresponding position of the anti-reflection layer 130.

The shape of both sides of each of the second emitter regions 12a and 12b exposed by the plurality of first and second openings 181 and 182 may be an even surface or an uneven surface.

The front electrode 141 is positioned on the electrode emitter region 12a, and also a portion of the front electrode 141 is positioned on the anti-reflection layer 130 adjacent to the front electrode 141. Accordingly, as shown in FIGS. 1 to 3, a width W21 of the front electrode 141 positioned on the electrode emitter region 12a is greater than the width W11 of the electrode emitter region 12a. For example, the width W21 of the front electrode 141 may be about 20 μm to 40 μm. Accordingly, an overhanging portion of the front electrode 141 is formed on a surface of the anti-reflection layer 130.

Accordingly, the front electrodes 141 are electrically and physically connected to the second emitter region 1212 (i.e., the electrode emitter regions 12a) of the emitter region 121.

The front electrodes 141 collect carriers (for example, electrons) moving to the electrode emitter regions 12a of the second emitter region 1212 through the first emitter region 1211 of the emitter region 121.

As described above, one first opening 181 exposing the electrode emitter region 12a is used to form one front electrode 141, and the about 30 to 70 second openings 182 exposing the bus bar emitter regions 12b may be used to form one front bus bar 142.

In the embodiment of the invention, a ratio of the formation width W3 of the bus bar emitter regions 12b corresponding to one front bus bar 142 to a total width of the second openings 182 underlying one front bus bar 142 may be about 1:0.2 to 1:0.5.

When the ratio is equal to or greater than about 1:0.2, one front bus bar 142 is more stably formed on the bus bar emitter regions 12b exposed through the second openings 182, and thus, has a desired width and desired conductivity.

When the ratio is equal to or less than about 1:0.5, time required to form the second openings 182 may be further saved. Further, an area of the emitter region 121 exposed to the heat for forming the second openings 182 may further decrease.

The front bus bars 142 are separated from one another and extend parallel to one another in a direction crossing the front electrodes 141. Each front bus bar 142 is electrically and physically connected to the bus bar emitter regions 12b of the second emitter region 1212 exposed through the second openings 182.

Because the anti-reflection layer 130 is positioned between the two adjacent bus bar emitter regions 12b, one front bus bar 142 is connected to the anti-reflection layer 130 as well as the plurality of bus bar emitter regions 12b.

Further, because the first emitter region 1211 is positioned under the anti-reflection layer 130 between the two adjacent bus bar emitter regions 12b, the first emitter region 1211 as well as the plurality of bus bar emitter regions 12b are positioned under one front bus bar 142.

Similar to the front electrode 141, a width W22 of one front bus bar 142 is greater than the total width (i.e., the formation width W3 of the plurality of bus bar emitter regions 12b) of the substrate 110, at which the plurality of bus bar emitter regions 12b underlying one front bus bar 142 are positioned. As shown in FIG. 3, the formation width W3 ranges from an outermost surface of an uppermost bus bar emitter region 12b to an outermost surface of a lowermost bus bar emitter region 12b among the plurality of bus bar emitter regions 12b underlying one front bus bar 142. For example, the width W22 of each front bus bar 142 may be about 1 mm to 1.5 mm.

In other words, each front bus bar 142 is electrically and physically connected to the electrode emitter regions 12a and the bus bar emitter regions 12b of the second emitter region 1212.

The front bus bars 142 are positioned on the same level layer as the front electrodes 141 and are electrically and physically connected to the front electrodes 141 at the crossings of the front electrodes 141 and the front bus bars 142.

Accordingly, as shown in FIGS. 1 to 3, the plurality of front electrodes 141 have a stripe shape extending in a fixed direction (or a first direction), for example, a transverse or longitudinal direction, and the plurality of front bus bars 142 have a stripe shape extending in a direction (or a second direction) crossing the front electrodes 141, for example, a longitudinal or transverse direction. Hence, the front electrode part 140 has a lattice shape on the front surface of the substrate 110.

The plurality of front bus bars 142 collect carriers collected by the front electrodes 141 as well as carriers moving from the second emitter region 1212 and then transfer the collected carriers in a corresponding direction.

The front bus bars 142 have to collect carriers collected by the front electrodes 141 crossing the front bus bars 142 and have to move the collected carriers in a desired direction. Thus, the width W22 of each front bus bar 142 may be greater than the width W21 of each front electrode 141.

The emitter region 121 according to the embodiment of the invention has the selective emitter structure including the first and second emitter regions 1211 and 1212. Thus, the first emitter region 1211 mainly performs (or enables) the movement of carriers to the front electrode part 140 and has the impurity doping concentration lower than the second emitter region 1212, and the second emitter region 1212 contacting the front electrode part 140 has the high impurity doping concentration. Hence, an amount of carriers moving from the second emitter region 1212 to the front electrode part 140 increases because of an increase in an amount of carriers moving to the front electrode part 140 through the first emitter region 1211 and an increase of the conductivity resulting from a concentration increase of impurities. As a result, an amount of carriers collected by the front electrode part 140 at the emitter region 121 increases, and the efficiency of the solar cell is greatly improved.

In addition, the second emitter region 1212, which mainly contacts the front electrodes 141 and the front bus bars 142 and outputs carriers, has the conductivity greater than the first emitter region 1211 and the sheet resistance less than the first emitter region 1211 because of its high impurity doping concentration. Hence, the contact resistance between the second emitter region 1212 and the front electrode part 140 decreases, and a transfer efficiency of carriers moving from the second emitter region 1212 to the front electrode part 140 is improved.

Because the width W11 of the electrode emitter regions 12a is less than the width W21 of the front electrode 141, a formation area of the electrode emitter region 12a, which is the heavily doped region, decreases. Further, the formation width W3 of the plurality of bus bar emitter regions 12b is less than the width W22 of the front bus bar 142, and the front bus bar 142 partially (or locally) contacts the second emitter region 1212 and is partially (or locally) connected to the bus bar emitter regions 12b, which are the heavily doped regions. Thus, a formation area of the heavily doped regions (i.e., the bus bar emitter regions 12b) underlying each front bus bar 142 decreases. Hence, an area of the emitter region 121 occupied by the heavily doped region (i.e., the second emitter region 1212) decreases, and a loss amount of carriers resulting from impurities greatly decreases. As a result, the efficiency of the solar cell is improved.

A conductive tape, for example, a ribbon is attached to the plurality of front bus bars 142, so as to connect the plurality of solar cells in series or parallel to one another. The plurality of front bus bars 142 are connected to an external device through the conductive tape. Thus, carriers (for example, electrons) collected by the front bus bars 142 are output to the external device through the conductive tape.

Because the front electrode 141 and the front bus bar 142 are positioned on the anti-reflection layer 130 as well as the second emitter regions 12a and 12b, the width of each of the front electrode 141 and the front bus bar 142 is greater than the width of each of the openings 181 and 182. The conductivity of each of the front electrode 141 and the front bus bar 142 is stably held due to an increase in the surface area and the cross-sectional area of the front electrode 141 and the front bus bar 142, and thus, the movement of carriers is stably carried out. Further, a contact area between the conductive tape attached to the front bus bar 142 and the front bus bar 142 increases, and thus, an adhesive strength between each front bus bar 142 and the conductive tape is further improved.

In the embodiment of the invention, the front electrode part 140 is formed using a plating method. More specifically, the plurality of first and second openings 181 and 182 exposing the emitter region 121 are formed in the anti-reflection layer 130, and then an electroplating process is performed on the emitter region 121 exposed by the plurality of first and second openings 181 and 182.

A growth of the plating is carried out in the horizontal direction as well as the vertical direction. The plating growth in the vertical direction and the horizontal direction is an isotropic growth having the almost equal thickness.

Accordingly, the front electrode 141 and the front bus bar 142 are positioned on the anti-reflection layer 130 positioned around the first and second openings 181 and 182 as well as the second emitter regions 12a and 12b exposed through the first and second openings 181 and 182. Further, thicknesses of the plating growth in the horizontal direction and the vertical direction are almost equal to each other. Therefore, a plating growth portion of each of the electrode emitter region 12a and the bus bar emitter region 12b has a shape of a curved surface.

Because the two adjacent bus bar emitter regions 12b are separated from each other at a short distance, plating growth portions, which are respectively grown on the two bus bar emitter regions 12b and are grown up to the anti-reflection layer 130, overlap and are connected to each other in a portion of the anti-reflection layer 130 between the two adjacent bus bar emitter regions 12b. Thus, the plating growth portions grown on the plurality of bus bar emitter regions 12b for one front bus bar 142 contact one another and form an integral body, thereby forming one front bus bar 142.

An upper surface (i.e., a surface positioned opposite a lower surface of each front bus bar 142) of each front bus bar 142 is a nonuniform surface having different heights depending on a location. Thus, the upper surface of each front bus bar 142 is an uneven surface (i.e., a curved surface) having a plurality of protrusions and a plurality of depressions. A height of the upper surface of the front bus bar 142 positioned on the bus bar emitter region 12b exposed through the second opening 182 is greater than a height of the upper surface of the front bus bar 142 positioned on the anti-reflection layer 130.

Hence, a roughness of the upper surface of each front bus bar 142 increases, and a contact area between each front bus bar 142 and the conductive tape increases. As a result, an amount of carriers moving from the front bus bars 142 to the conductive tape increases.

Further, as shown in FIG. 4, when the distances D11 between the plurality of bus bar emitter regions 12b positioned under each front bus bar 142 are different from one another depending on a location, an overlap area of plating growth portions on the adjacent bus bar emitter regions 12b positioned at an edge of each front bus bar 142 is greater than an overlap area of plating growth portions on the adjacent bus bar emitter regions 12b positioned in the middle of each front bus bar 142. Hence, a height of the front bus bar 142 grown at an edge of one front bus bar 142 is greater than a height of the front bus bar 142 grown in the middle of one front bus bar 142.

Figure 5:
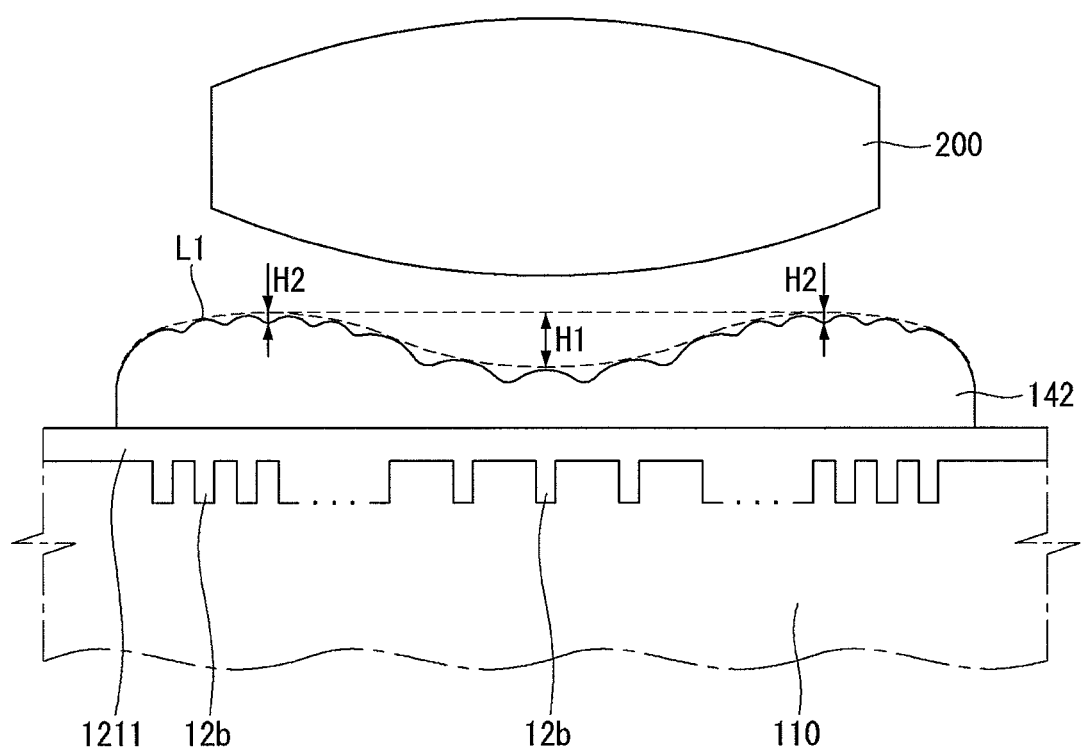
FIG. 5 is a schematic cross-sectional view of an example where a conductive film is positioned on a front bus bar according to an example embodiment of the invention.

As shown in FIG. 5, in a virtual upper surface formed by a virtual line L1 obtained by connecting the protrusions of the upper surface of one front bus bar 142, a difference H1 between a minimum height of the upper surface in the middle portion of the front bus bar 142 and a maximum height of the upper surface at the edge of the front bus bar 142 increase. Hence, a height difference H2 in the virtual upper surface is much greater than a height difference H2 between the two adjacent protrusions formed by the two adjacent second openings 182.

As shown in FIG. 5, the schematic upper surface (i.e., the virtual upper surface) of the front bus bar 142 has a protrudent cross-sectional shape at its edge and a depressed cross-sectional shape in its middle portion. Hence, the height of the middle portion of one front bus bar 142 is different from the height of the edge of one front bus bar 142. Namely, the height of the edge of the front bus bar 142 is greater than the height of the middle portion of the front bus bar 142.

As shown in FIG. 5, a lower surface of a conductive film 200, which is generally positioned on the front bus bar 142 and is connected to the front bus bar 142, has a protrudent curved surface, in which a height in its middle portion is greater than a height at its edge.

Accordingly, a contact area between the conductive film 200 and the front bus bar 142 increases because of the uneven upper surface of the front bus bar 142. Further, the upper surface of the front bus bar 142 and the lower surface of the conductive film 200, which contact each other, have reciprocal shapes. Hence, the front bus bar 142 and the conductive film 200 easily and stably contact each other.

When the distance D11 between the bus bar emitter regions 12b positioned in the middle of the formation width W3 of the plurality of bus bar emitter regions 12b corresponding to each front bus bar 142 is equal to or greater than about 1.5 times the distance D11 between the bus bar emitter regions 12b positioned at the edge of the formation width W3, a middle portion of the upper surface of the front bus bar 142 may be depressed. Hence, the junction efficiency between the front bus bar 142 and the conductive film 200 may be improved. When the distance D11 between the bus bar emitter regions 12b positioned in the middle of the formation width W3 of the plurality of bus bar emitter regions 12b corresponding to each front bus bar 142 is equal to or less than about 5 times the distance D11 between the bus bar emitter regions 12b positioned at the edge of the formation width W3, the front bus bar 142 having the desired surface area and the conductivity may be more stably formed.

In the embodiment of the invention, the height difference or the slope H1 of the upper surface between the middle portion of the front bus bar 142 and the edge of the front bus bar 142 may change depending on the slope of the lower surface of the conductive film positioned on the front bus bar 142. The height difference or the slope H1 of the upper surface of the front bus bar 142 may change depending on the width of the second opening 182 and the distance between the two adjacent second openings 182.

On the other hand, because each front electrode 141 is formed using one first opening 181, the front electrode 141 may have the smooth curved surface having the protrudent shape, instead of the uneven surface having the plurality of protrusions and the plurality of depressions.

Because the front electrodes 141 and the front bus bars 142 are simultaneously formed through the same plating process, the front electrodes 141 and the front bus bars 142 have the same structure and material.

Further, because the front electrode part 140 is formed through the plating process, a density of the front electrode part 140 formed through the plating process is much greater than a density of a front electrode part formed through a screen printing method using a silver paste, etc. Hence, the conductivity of the front electrode part 140 is greatly improved.

The front electrode part 140 including the front electrodes 141 and the front bus bars 142 may have a single-layered structure formed of silver (Ag), etc., or a multi-layered structure, for example, a double-layered structure and a triple-layered structure.

When the front electrode part 140 has the single-layered structure formed of silver (Ag), a specific resistance of the front electrode part 140 may be about 1.6 uΩcm to 2.5 uΩcm and is much less than a specific resistance (about 6.7 uΩcm) of the front electrode part 140 formed through the screen printing method using the Ag paste.

When the front electrode part 140 has the double-layered structure, a lower layer of the front electrode part 140 contacting the emitter region 121 may be formed of nickel (Ni) and an upper layer of the front electrode part 140 positioned on the lower layer may be formed of silver (Ag). In this instance, a thickness of the lower layer may be about 0.5 μm to 1 μm, and a thickness of the upper layer may be about 5 μm to 10 μm. When the front electrode part 140 has the triple-layered structure, a lower layer of the front electrode part 140 contacting the emitter region 121 may be formed of nickel (Ni), a middle layer of the front electrode part 140 positioned on the lower layer may be formed of copper (Cu), and an upper layer of the front electrode part 140 positioned on the middle layer may be formed of silver (Ag) or tin (Sn). In this instance, a thickness of each of the lower layer and the upper layer may be about 0.5 μm to 1 μm, and a thickness of the middle layer may be about 5 μm to 10 μm.

When the lower layer of the front electrode part 140 is formed of nickel (Ni), nickel silicide exists between the lower layer and the emitter region 121 due to the coupling between nickel (Ni) and the material (i.e., silicon of the second conductive type region of the substrate 110) for forming the emitter region 121.

On the other hand, when the front electrodes 141 and the front bus bars 142 are formed through the screen printing method using an Ag paste containing a glass fit, the glass frit passes through the anti-reflection layer 130 and contacts the emitter region 1212. Therefore, at least one of components of the glass frit is detected in a portion, in which the front electrodes 141 and the front bus bars 142 contact the emitter region 1212. For example, at least one of lead (Pb)-based material such as PbO, bismuth (Bi)-based material such as $Bi_2O_3$, aluminum (Al)-based material such as $Al_2O_3$, boron (B)-based material such as $B_2O_3$, tin (Sn)-based material, zinc (Zn)-based material such as ZnO, titanium (Ti)-based material such as TiO, and phosphorus (P)-based material such as $P_2O_5$ is detected.

However, in the embodiment of the invention, because the front electrodes 141 and the front bus bars 142 are formed through the plating process, the components of the glass fit are not detected.

FIG. 1 shows an example of the number of front electrodes 141, the number of front bus bars 142, and the number of second emitter regions 1212 positioned on the substrate 110. The number for the front electrodes 141, the number for the front bus bars 142 and/or the number for the second emitter regions 1212 may vary, if desired or necessary.

The surface field region 172 is a region (for example, a $p^+$-type region) which is more heavily doped than the substrate 110 with impurities of the same conductive type as the substrate 110.

A potential barrier is formed by a difference between impurity doping concentrations of the first conductive type region of the substrate 110 and the surface field regions 172. Hence, the potential barrier prevents or reduces electrons from moving to the surface field regions 172 used as a moving path of holes and makes it easier for holes to move to the surface field regions 172. Thus, the surface field regions 172 reduce an amount of carriers lost by a recombination and/or a disappearance of the electrons and the holes at and around the back surface of the substrate 110 and accelerates a movement of desired carriers (for example, holes), thereby increasing the movement of carriers to the back electrode part 150.

The back electrode part 150 includes the back electrode 151 and the plurality of back bus bars 152 connected to the back electrode 151.

The back electrode 151 contacts the surface field regions 172 positioned at the back surface of the substrate 110 and is substantially positioned on the entire back surface of the substrate 110 except an edge of the back surface of the substrate 110 and a formation area of the back bus bar 152.

The back electrode 151 contains a conductive material, for example, aluminum (Al) or silver (Ag).

The back electrode 151 collects carriers (for example, holes) moving to the surface field regions 172.

Because the back electrode 151 contacts the surface field region 172 having the impurity doping concentration higher than the substrate 110, a contact resistance between the substrate 110 (i.e., the surface field region 172) and the back electrode 151 decreases. Hence, the transfer efficiency of carriers from the substrate 110 to the back electrode 151 is improved.

The plurality of back bus bars 152 are positioned on the back surface of the substrate 110, on which the back electrode 151 is not positioned, and are connected to the back electrode 151.

Further, the plurality of back bus bars 152 are positioned opposite the plurality of front bus bars 142 with the substrate 110 interposed therebetween. In embodiments of the invention, the plurality of back bus bars 152 and the plurality of front bus bars 142 are aligned.

The back bus bars 152 collect carriers transferred from the back electrode 151, similar to the front bus bars 142.

The conductive film is positioned on the back bus bars 152 in the same manner as the front bus bars 142. Hence, the back bus bars 152 are connected to the external device through the conductive film and output the collected carriers (for example, holes) to the external device.

The back bus bars 152 may be formed of a material having better conductivity than the back electrode 151. The back bus bars 152 may contain at least one conductive material, for example, silver (Ag). Thus, the back electrode 151 and the back bus bars 152 may be formed of different materials.

In an alternative example, the emitter region 121 of the solar cell may not have the selective emitter structure.

In this instance, an impurity doping concentration, an impurity doping thickness, and a sheet resistance of a portion of the emitter region 121 underlying the anti-reflection layer 130 are the same as an impurity doping concentration, an impurity doping thickness, and a sheet resistance of a portion of the emitter region 121 (underlying the front electrode part 140), on which the anti-reflection layer 130 is not positioned. Thus, the emitter region 121 may have the same sheet resistance, for example, the sheet resistance of about 50 Ω/sq. to 80 Ω/sq. irrespective of its location.

An operation of the solar cell having the above-described structure is described below.

When light irradiated to the solar cell is incident on the substrate 110 through the anti-reflection layer 130, a plurality of electron-hole pairs are generated in the semiconductor part 110 by light energy produced based on the incident light. In this instance, because a reflection loss of the light incident on the substrate 110 is reduced by the anti-reflection layer 130, an amount of light incident on the substrate 110 increases.

The electrons move to the n-type emitter region 121 and the holes move to the p-type substrate 110 due to the p-n junction of the substrate 110 and the emitter region 121. The electrons moving to the emitter region 121 sequentially move to the first emitter region 1211 and the second emitter region 1212, are collected by the front electrodes 141 and the front bus bars 142, and move along the front bus bars 142. The holes moving to the substrate 110 are collected by the back electrode 151 and the back bus bars 152 and move along the back bus bars 152. When the front bus bars 142 are connected to the back bus bars 152 using the conductive tape, current flows therein to thereby enable use of the current for electric power.

A loss amount of carriers is reduced because of the emitter region 121 having the selective emitter structure, and an amount of carriers moving to the front electrodes 141 increases. Hence, the efficiency of the solar cell is greatly improved.

Because the front electrode part 140 according to the embodiment of the invention is formed using the plating method, the width of each front electrode 141 is much less than the width (for example, about 80 μm to 120 μm) of each front electrode 141 formed using the screen printing method. Hence, the formation area of the front electrodes 141 for blocking the incidence of light decreases, and thus, the incidence area of light incident on the solar cell increases. As a result, the efficiency of the solar cell is improved.

When the emitter region 121 having the selective emitter structure is formed, the heavily doped region (i.e., the second emitter region 1212) of the emitter region 121 is selectively positioned under the front bus bars 142, and also the width of the second emitter region 1212 is less than the width of the front electrode 141. Therefore, the formation area of the heavily doped region decreases. As a result, an amount of carriers lost by impurities greatly decreases.

A method for manufacturing a solar cell according to an example embodiment of the invention is described below with reference to FIGS. 6A to 6F.

Figure 6A:
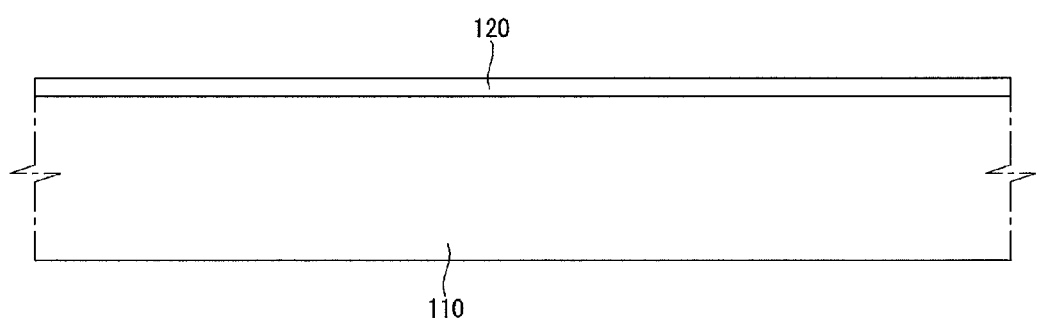
FIGS. 6A to 6F sequentially illustrate a method for manufacturing a solar cell according to an example embodiment of the invention.

As shown in FIG. 6A, an emitter layer 120 containing impurities (for example, phosphorus (P)) of a second conductive type is formed at a front surface of a substrate 110 of a first conductive type (for example, p-type), which is formed of single crystal silicon or polycrystalline silicon. The emitter layer 120 may be formed using an ion implantation method or a thermal diffusion method, and may form a p-n junction along with a first conductive type region of the substrate 110. A sheet resistance of the emitter layer 120 may be about 80 Ω/sq. to 120 Ω/sq. As described above, because the impurities of the second conductive type are injected into the substrate 110 to form the emitter layer 120, the emitter layer 120 is formed of the same material (i.e., crystalline semiconductor such as single crystal silicon and polycrystalline silicon) as the substrate 110. Hence, the substrate 110 and the emitter layer 120 form a homojunction.

In an alternative example, before forming the emitter layer 120 or after forming the emitter layer 120, a dry etching method such as a reaction ion etching method, or a wet etching method may be performed on the flat front surface (or the surface of the emitter layer 120) of the substrate 110 or the flat front surface and a flat back surface of the substrate 110 to form a textured surface corresponding to an uneven surface having a plurality of protrusions and a plurality of depressions or having uneven characteristics on the front surface of the substrate 110 or the front surface and the back surface of the substrate 110. As described above, when the surface of the substrate 110 has the textured surface, an anti-reflection effect of light incident on the substrate 110 is improved, and an amount of light incident on the substrate 110 increases.

Figure 6B:
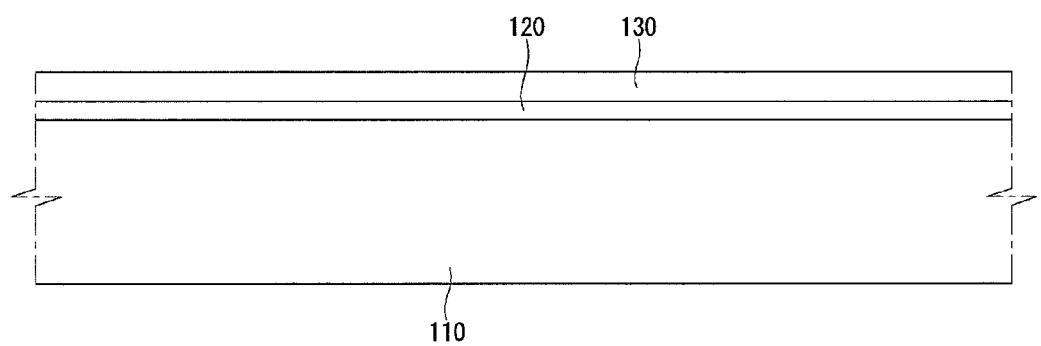

Next, as shown in FIG. 6B, an anti-reflection layer 130 is formed on the emitter layer 120 formed at the front surface of the substrate 110 using a deposition method such as a plasma enhanced chemical vapor deposition (PECVD) method. The anti-reflection layer 130 may be formed of hydrogenated silicon nitride (SiNx:H), hydrogenated silicon oxide (SiOx:H), hydrogenated silicon oxynitride (SiOxNy:H), or aluminum oxide (AlxOy), etc.

Figure 6C:
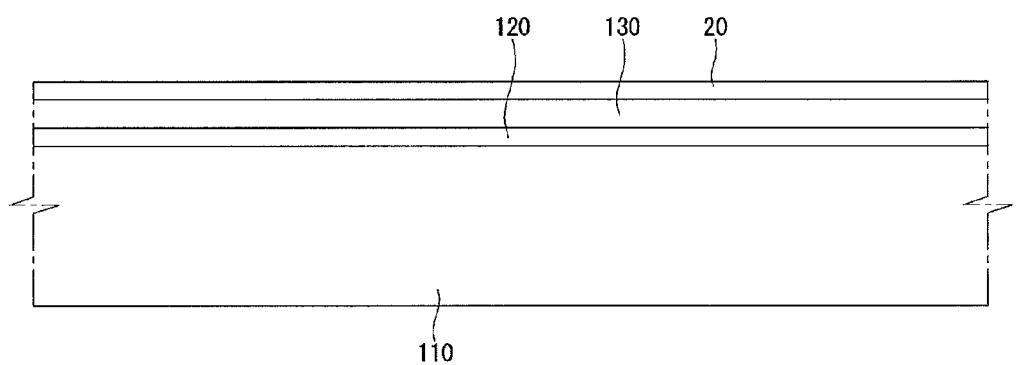

Next, as shown in FIG. 6C, an impurity layer 20 containing impurities of the second conductive type is formed on the anti-reflection layer 130 using an inkjet printing method, a spin coating method, or a screen printing method, etc.

Figure 6D:
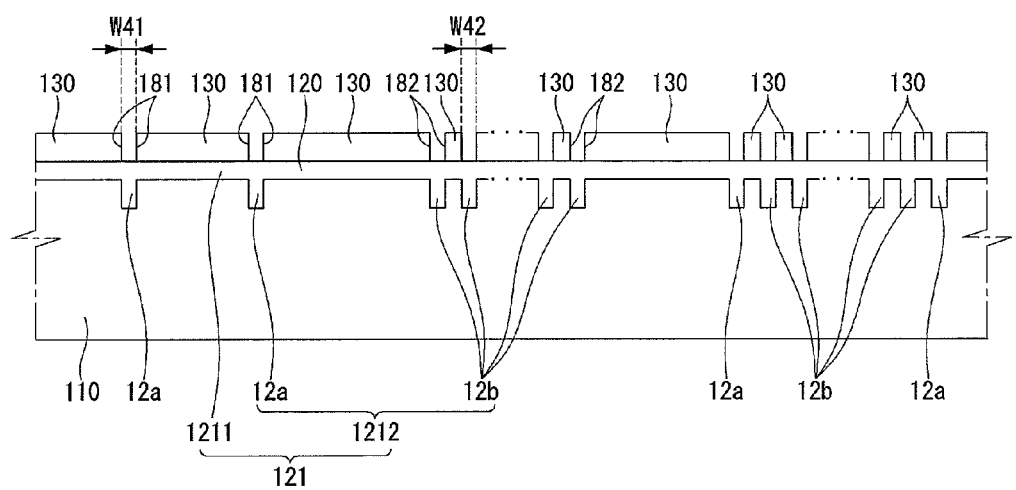

Next, as shown in FIG. 6D, a laser beam is locally irradiated onto the anti-reflection layer 130 via the impurity layer 20 to form a plurality of first and second openings 181 and 182 exposing the emitter layer 120 in the anti-reflection layer 130.

Figure 7:
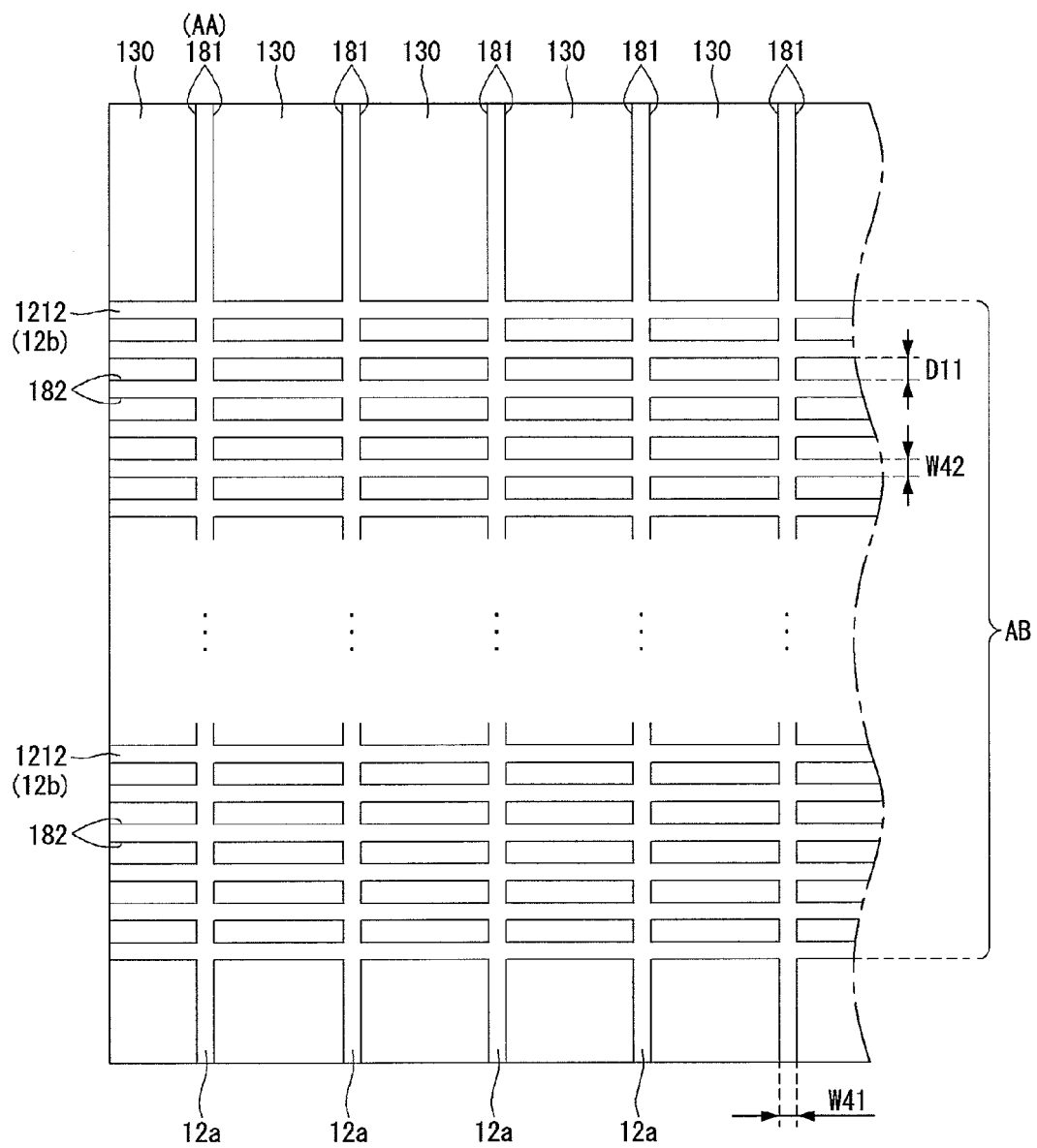
FIGS. 7 and 8 are schematic plane views of a plurality of first and second openings formed on an anti-reflection layer.

Widths W41 and W42 of the first and second openings 181 and 182 are substantially equal to each other and may be about 5 μm to 15 μm. The plurality of first openings 181 are front electrode openings for forming a plurality of front electrodes 141, and the plurality of second openings 182 are front bus bars openings for forming a plurality of front bus bars 142. As shown in FIG. 7, because one first opening 181 is used to form one front electrode 141, one first opening 181 is formed in an area AA (hereinafter referred to as 'front electrode formation area' or 'first electrode formation area') of the anti-reflection layer 130 for forming one front electrode 141. Thus, the number of first openings 181 is the same as the number of front electrodes 141.

On the other hand, about 30 to 70 second openings 182 are used to form one front bus bar 142 having a width of about 1 mm to 1.5 mm. Thus, about 30 to 70 second openings 182 are formed in an area AB (hereinafter referred to as 'front bus bar formation area' or 'first bus bar formation area') of the anti-reflection layer 130 for forming one front bus bar 142. Thus, the number of second openings 182 is much more than the number of front bus bar 142.

As described above, when the separated second openings 182 are used to form one front bus bar 142 instead of using one second opening 182 having the same width as one front bus bar 142, a ratio of a width of the front bus bar formation area AB of the anti-reflection layer 130 or a formation width W3 of a plurality of bus bar emitter regions 12b corresponding to one front bus bar 142 to a total width of the second openings 182 underlying one front bus bar 142 may be about 1:0.2 to 1:0.5.

When the laser beam is irradiated onto the anti-reflection layer 130, on which the impurity layer 20 is coated, to form the plurality of first and second openings 181 and 182 exposing the emitter layer 120, the impurities of the second conductive type contained in the impurity layer 20 positioned on the anti-reflection layer 130 are additionally injected into a portion of the emitter layer 120 exposed through the first and second openings 181 and 182. Hence, the emitter layer 120 is locally doped.

Accordingly, the irradiation of the laser beam is to form the plurality of first and second openings 181 and 182 at a desired location of the anti-reflection layer 130 by removing a desired portion of the anti-reflection layer 130, and to additionally dope a desired portion of the emitter layer 120 with the impurities of the second conductive type.

A portion of the emitter layer 120 (exposed through the first and second openings 181 and 182), onto which the laser beam is irradiated, has an impurity doping concentration higher than other portion of the emitter layer 120, onto which the laser beam is not irradiated, and thus, has a sheet resistance less than an initial sheet resistance of the emitter layer 120.

For example, the portion of the emitter layer 120 exposed through the first and second openings 181 and 182 has the sheet resistance of about 10 Ω/sq. to 50 Ω/sq., which is less than the initial sheet resistance (for example, about 80 Ω/sq. to 120 Ω/sq.) of the emitter layer 120.

After the irradiation of the laser beam is completed, the emitter layer 120 becomes an emitter region 121 having a selective emitter structure including a first emitter region 1211, which is positioned under the anti-reflection layer 130 and has a sheet resistance (or a first sheet resistance) of about 80 Ω/sq. to 120 Ω/sq., and a second emitter region 1212, which is positioned in the portion of the emitter layer 120 exposed through the first and second openings 181 and 182 and has a sheet resistance (or a second sheet resistance) of about 10 Ω/sq. to 50 Ω/sq. Thus, the widths W41 and W42 of the first and second openings 181 and 182 may be substantially the same as widths W11 and W12 of the second emitter region 1212 formed by the first and second openings 181 and 182. A distance D11 between the two adjacent second openings 182 among the plurality of second openings 182 used to form one front bus bar 142 may be substantially the same as a distance D11 between the two adjacent second emitter regions 1212 formed by the two adjacent second openings 182.

Afterwards, the impurity layer 20 remaining on the anti-reflection layer 130 is removed using hydrofluoric acid (HF) or pure water.

Figure 8:
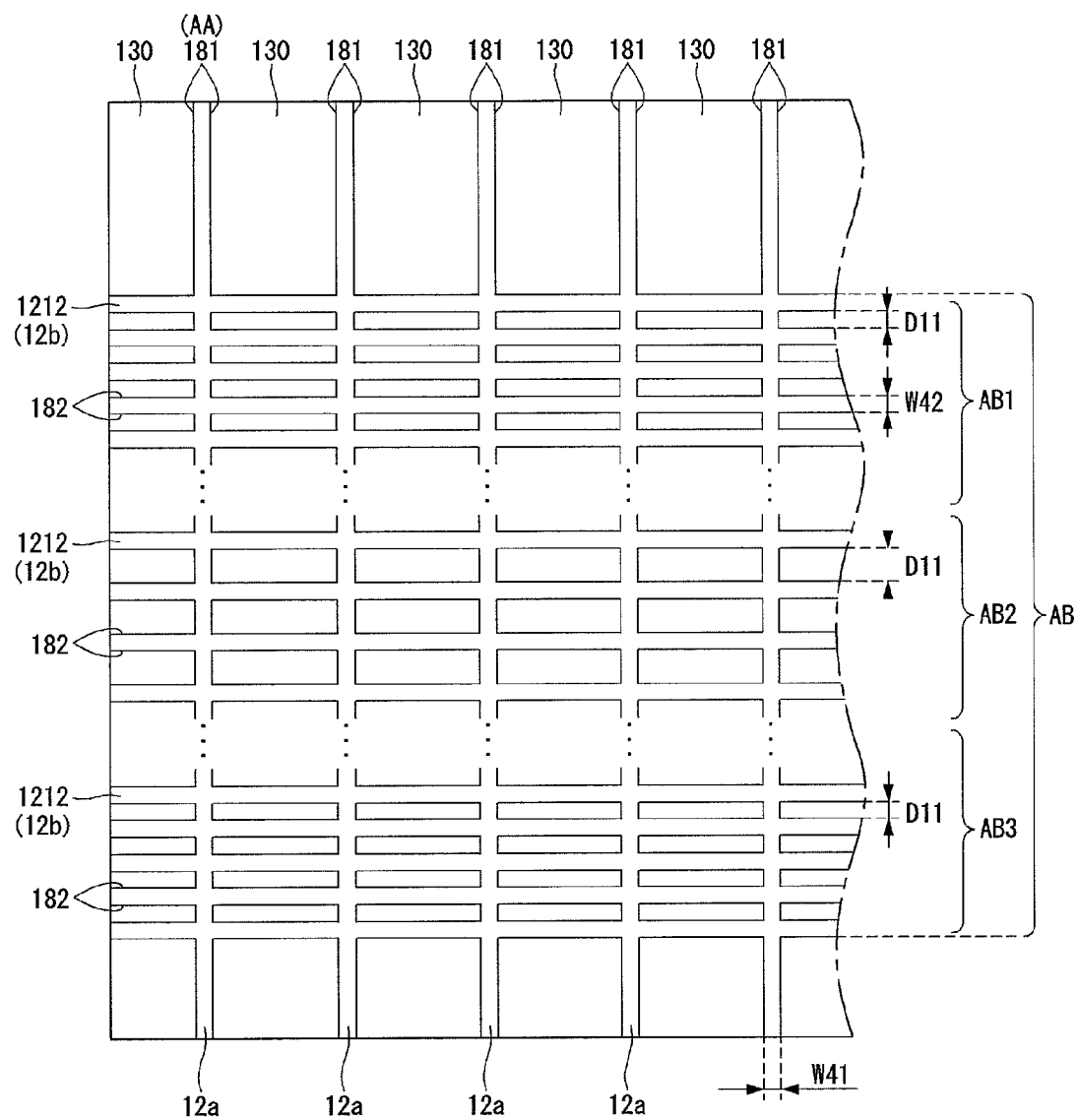

As shown in FIG. 7, the plurality of second openings 182 may be separated from each other at the uniform distance D11 therebetween in one front bus bar formation area AB. Alternatively, as shown in FIG. 8, the plurality of second openings 182 may be separated from each other at the different distances D11 therebetween in one front bus bar formation area AB. For example, the distance D11 between the two adjacent second openings 182 may be about 15 μm to 30 μm.

When the plurality of second openings 182 are separated from each other at the different distances D11 therebetween in one front bus bar formation area AB, the distance D11 between the two adjacent second openings 182 positioned in the middle of one front bus bar formation area AB or one front bus bar 142 may be about 1.5 times to 5 times the distance D11 between the two adjacent second openings 182 positioned in the edge of one front bus bar formation area AB or one front bus bar 142.

As shown in FIG. 8, when the plurality of second openings 182 are separated from each other at the different distances D11 in one front bus bar formation area AB, the distance D11 between the two adjacent second openings 182 positioned in the middle of one front bus bar formation area AB may be greater than the distance D11 between the two adjacent second openings 182 positioned in the edge of one front bus bar formation area AB. The front bus bar formation area AB may be divided into three parts in a direction (for example, Y-axis direction) crossing the front bus bar 142 to obtain three sub-areas AB1, AB2, and AB3. In this instance, the edge of the front bus bar formation area AB may correspond to the two sub-areas AB1 and AB3 positioned at both ends of the front bus bar formation area AB, and the middle of the front bus bar formation area AB may correspond to the sub-area AB2 positioned in the middle of the front bus bar formation area AB.

The plurality of first and second openings 181 and 182 of the anti-reflection layer 130 are used to contact the emitter region 121 (i.e., the second emitter region 1212) to the front electrodes 141 and the front bus bars 142 when the front electrodes 141 and the front bus bars 142 are formed using the plating method.

The number of second openings 182, which are formed in one front bus bar formation area AB of the anti-reflection layer 130 and are used to form one front bus bar 142, is described in more detail below.

In a solar cell according to a comparative example, a front electrode part including a plurality of front electrodes and a plurality of front bus bars is generally manufactured by applying a silver (Ag) paste containing silver (Ag) to the front electrode part in a fixed pattern according to a shape of the front electrode part using the screen printing method and performing a thermal process.

A specific resistance of each of the front bus bars manufactured using the Ag paste is about 6.7 uΩcm, and a cross-sectional area of one front bus bar may be about 37,500 μm² (=1,500 μm wide×25 μm thick). Further, a contact resistance of each front bus bar is about 3 uΩcm.

As described above, the width and the thickness of each front bus bar used in the comparative example are about 1,500 μm (1.5 mm) and about 25 μm, respectively.

The front electrode part may be manufactured using the plating method, so as to increase the incidence area of the solar cell by reducing the widths of the front electrode and the front bus bar while maintaining the same operational characteristics as the front electrodes and the front bus bars manufactured using the screen printing method. In this instance, the widths of the front electrode and the front bus bar manufactured using the plating method may be reduced.

Accordingly, the front bus bars 142 of the solar cell according to the embodiment of the invention are manufactured using the plating method.

When the front bus bars 142 are manufactured using the plating method, the anti-reflection layer 130 positioned on the emitter layer 120 is partially (or locally) removed to form the plurality of second openings 182, so that the emitter region 121 contacts the front bus bars 142.

When the plating process is performed on the second emitter region 1212 exposed through the plurality of second openings 182, the plating process is performed in both the vertical and horizontal directions of the second emitter region 1212. The plating growth of the second emitter region 1212 is an isotropic growth, in which the plating thickness of the second emitter region 1212 is almost uniform in the vertical and horizontal directions. Thus, the plated metal material (for example, silver) is completely filled in the second openings 182 and is grown up to the height of the upper surface (i.e., the contact surface between the anti-reflection layer 130 and the front electrode part 140) of the anti-reflection layer 130 adjacent to the second openings 182. Afterwards, the plating process is performed above the upper surface of the anti-reflection layer 130 in the horizontal direction, and thus, is performed on the anti-reflection layer 130 adjacent to the second openings 182 beyond the width of the second openings 182.

Characteristics of the front electrodes 141 and the front bus bars 142 manufactured using the plating method are described below with reference to FIGS. 9 and 10.

Figure 9:
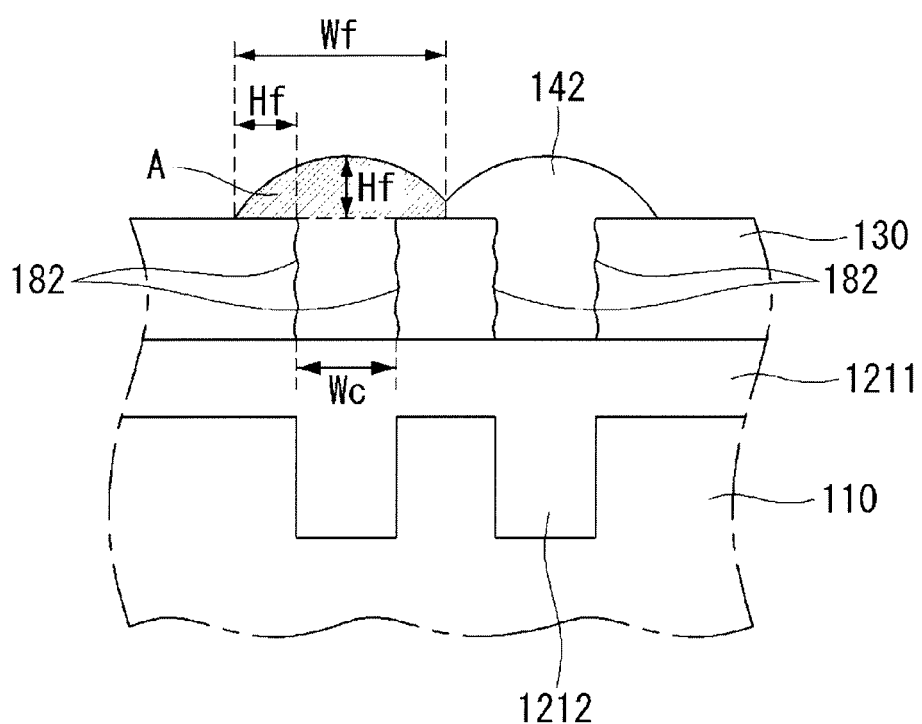
FIG. 9 is a schematic cross-sectional view of a portion of a front bus bar plated on a second emitter region exposed by a second opening.
Figure 10:
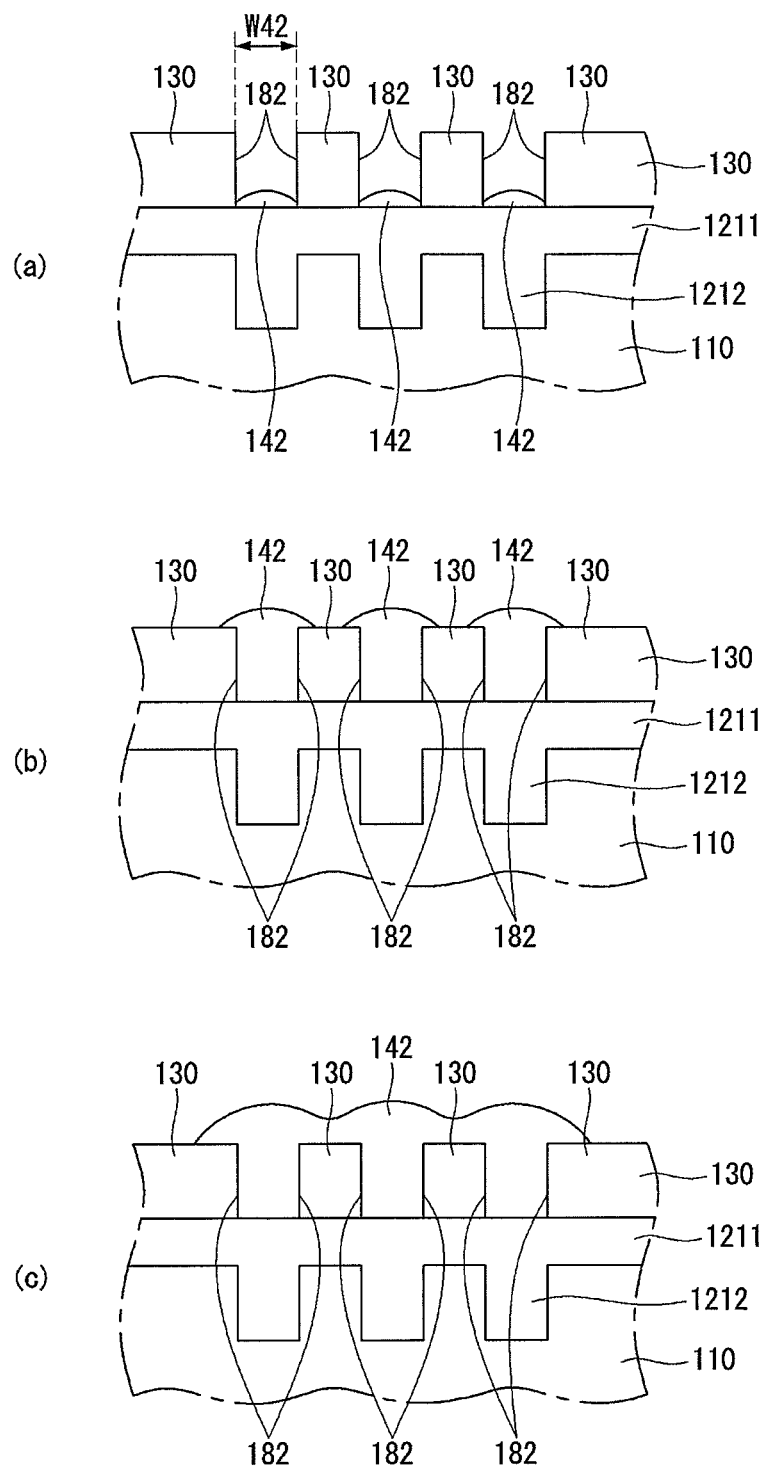
FIG. 10 is a schematic cross-sectional view of an example where a plating process is performed on a second emitter region exposed by a second opening to form a front bus bar.

In FIGS. 9 and 10, the surface of the substrate 110 is shown as not the textured surface but the flat surface for sake of brevity and ease of reading.

As shown in FIG. 9, the anti-reflection layer 130 is removed to form the second opening 182 (or the first opening 181) having a fixed width Wc. Then, when the plating process is performed on the second emitter region 1212 exposed through the second opening 182, a plated thickness measured from the upper surface of the anti-reflection layer 130 is denoted as 'Hf'. Because the isotropic plating growth is carried out, a plated thickness of the anti-reflection layer 130 measured from an end of the second opening 182 (or the first opening 181) in the horizontal direction is denoted as 'Hf'. Thus, an upper surface of a plated portion on the second emitter region 1212 exposed through the second opening 182 (or the first opening 181) had a curved surface.

In FIG. 9, a total width Wf of the plated front bus bar 142 is equal to (or substantially equal to) a sum (Wc+2 Hf) of the width Wc of the second opening 182 and two times (i.e., 2 Hf) the plated thickness Hf of the anti-reflection layer 130. A specific resistance of the plated metal (for example, silver) is about 2.2 uΩcm and corresponds to about ⅓ of a specific resistance (about 6.7 uΩcm) of the front bus bar manufactured using the Ag paste. Further, a contact resistance of the plated metal (for example, silver) is about 1 mΩcm and corresponds to about ⅓ of a contact resistance (about 3 uΩcm) of the front bus bar manufactured using the Ag paste.

As described above, the specific resistance and the contact resistance of the front bus bar 142 manufactured using the plating method correspond to about ⅓ of the specific resistance and the contact resistance of the front bus bar manufactured using the Ag paste. Therefore, when the front bus bar 142 manufactured using the plating method and the front bus bar manufactured using the Ag paste have the same cross-sectional area, the operational characteristics (for example, the contact characteristic and the conductivity) of the front bus bar 142 manufactured using the plating method are about three times better than the operational characteristics of the front bus bar manufactured using the Ag paste.

In FIG. 9, when both Wc and Hf are equal to or about 10 μm, a partial cross-sectional area 'A' of the front bus bar 142, which is plating-grown from one second opening 182, is about 257 μm².

A cross-sectional area A1 of one front bus bar 142 having the same line resistance as the front bus bar manufactured using the Ag paste may be calculated based on an equation: R (line resistance)=[ρ(specific resistance)×l (length)]/A1 (cross-sectional area). In this instance, it is assumed that the front bus bar 142 manufactured using the plating method and the front bus bar manufactured using the Ag paste have the same length 'l'. Thus, the length 'l' is omitted in the above equation.

When the line resistance of the front bus bar manufactured using the Ag paste is expressed by Rpaste, the Rpaste is $6.7/37500$ ($=1.786\times10^{-4}\Omega$) because the specific resistance of the front bus bar is 6.7 uΩcm and the cross-sectional area of the front bus bar is 37,500 μm².

When a line resistance Rplating of the front bus bar 142 manufactured using the plating method is equal to the line resistance Rpaste of the front bus bar manufactured using the Ag paste, the cross-sectional area A1 of the front bus bar 142 is calculated as follows. In this instance, as described above, the specific resistance of the front bus bar 142 manufactured using the plating method is 2.2 uΩcm.

In the line resistance Rplating ($=\rho/A1$) of the front bus bar 142 manufactured using the plating method, because the line resistance Rplating ($=\rho/A1$) is $1.786\times10^{-4}\Omega$ ($=2.2/A1$), the cross-sectional area A1 of the front bus bar 142 is about 12,313 μm².

The number of second openings 182 of the anti-reflection layer 130 used to form one front bus bar 142 is calculated by dividing the cross-sectional area A1 of one front bus bar 142 by the cross-sectional area A of the plating growth portion of one second opening 182. The number of second openings 182 each having the width of about 10 μm may be about 48.

In other words, the 48 second openings 182 of about 10 μm width are formed in the anti-reflection layer 130 so as to form one front bus bar of about 1.5 mm width, instead of forming one second opening 182 of about 1.5 mm width in the anti-reflection layer 130. Afterwards, when the plating process is performed on the second openings 182 to form one front bus bar 142, the width of one front bus bar 142 formed on the second openings 182 is about 1.5 mm because the plating growth of the front bus bar 142 is the isotropic growth performed in the vertical and horizontal directions of the second openings 182.

Accordingly, when the front bus bar 142 having the width of about 1 mm to 1.5 mm is formed on the emitter region 121 exposed through the second openings 182 using the plating method, the about 30 to 70 second openings 182 having the width of about 5 μm to 15 μm may be necessary. In this instance, the distance between the two adjacent second openings 182 may be about 15 μm to 30 μm. The number of second openings 182 changes depending on the width of each second opening 182 and the distance between the two adjacent second openings 182.

When the distance between the two adjacent second openings 182 is equal to or greater than about 15 μm, the formation area of the heavily doped region (i.e., the bus bar emitter region 12b) decreases. Hence, a loss amount of carriers resulting from the bus bar emitter region 12b more stably decreases. When the distance between the two adjacent second openings 182 is equal to or less than about 30 μm, the portions of the front bus bar 142 grown in the two adjacent second openings 182 stably contact each other. Hence, one front bus bar 142 having the stable conductivity is formed on the plurality of second openings 182.

Instead of entirely removing the anti-reflection layer 130 of an area to form one front bus bar 142 using the laser beam, the anti-reflection layer 130 of an area to form one front bus bar 142 is partially or selectively removed using the laser beam to thereby form the front bus bars 142. Thus, the irradiation area of the anti-reflection layer 130, onto which the laser beam is irradiated, decreases.

Hence, irradiation time of the laser beam is reduced, and the degradation of the emitter region 121 or the substrate 110 resulting from heat applied by the laser beam is prevented or reduced. Further, manufacturing time of the solar cell is reduced, and the characteristic changes of the solar cell are prevented or reduced.

In the embodiment of the invention, when the number of second openings 182 used to form one front bus bar 142 is equal to or greater than 30, the front bus bars 142 each having the stable conductivity and the surface area are formed. Further, when the number of second openings 182 used to form one front bus bar 142 is equal to or less than 70, manufacturing time is saved, and the irradiation area of the laser beam is reduced.

Instead of removing the anti-reflection layer 130 using an etching paste or a separate mask, the laser beam is directly irradiated onto the anti-reflection layer 130 to remove a desired portion of the anti-reflection layer 130. Thus, the widths of the first and second openings 181 and 182 thus formed are much less than widths of the first and second openings 181 and 182 formed using the etching paste or the separate mask.

Hence, the formation area of the second emitter region 1212 (i.e., the heavily doped region) decreases, and the formation width of the front electrodes 141 decreases. As a result, the formation area of the front electrodes 141 decreases.

In the embodiment of the invention, the laser beam used to form the first and second openings 181 and 182 may have a wavelength of about 532 nm and power of about 5 W to 20 W. The power or irradiation time of the laser beam may be determined depending on the material or the thickness of the anti-reflection layer 130.

Each of the first openings 181 and each of the second openings 182 formed by the irradiation of the laser beam may have an even lateral surface or an uneven lateral surface.

When both lateral surfaces of each of the second emitter regions 12a and 12b exposed through the first and second openings 181 and 182 are even, the laser beam used may have a stripe shape having the same width as the first and second openings 181 and 182. When both lateral surfaces of each of the second emitter regions 12a and 12b exposed through the first and second openings 181 and 182 are uneven, the laser beam used may have a spot shape having the same width as the first and second openings 181 and 182.

When both lateral surfaces of each of the second emitter regions 12a and 12b exposed through the first and second openings 181 and 182 are uneven, the area of the second emitter regions 12a and 12b exposed through the first and second openings 181 and 182 increases. Therefore, a contact area where the front electrode 141 and the front bus bar 142 contact the second emitter regions 12a and 12b increases. When the first and second openings 181 and 182 are formed using the laser beam having the stripe shape, formation time of the first and second openings 181 and 182 decreases.

Figure 6E:
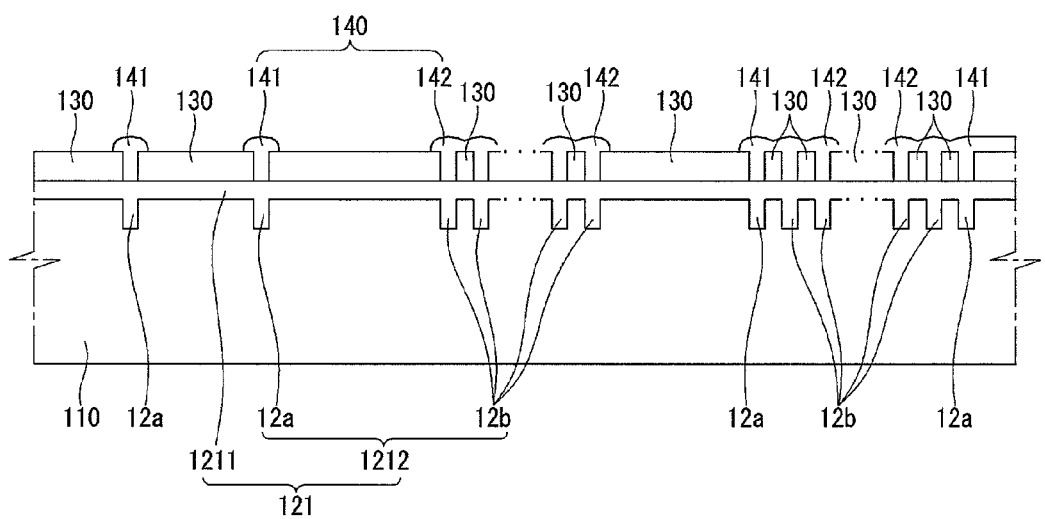
Figure 6F:
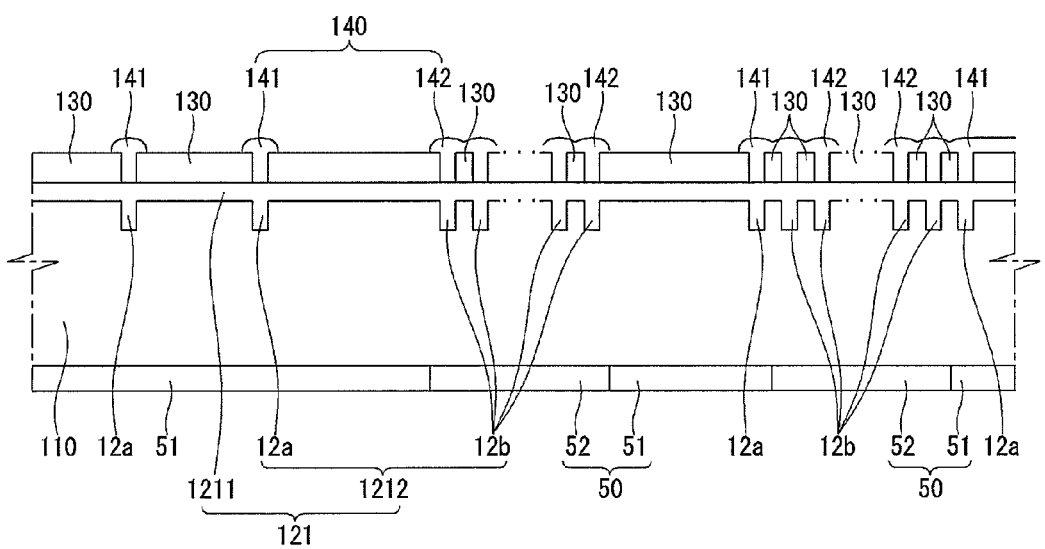

As shown in FIG. 6E, when the plurality of first and second openings 181 and 182 are formed in the anti-reflection layer 130 so as to form the front electrode part 140 using the plating method, the plating process is performed on the second emitter region 1212 exposed through the plurality of first and second openings 181 and 182 to form the front electrode part 140 including the front electrodes 141 and the front bus bars 142. In this instance, the plating method such as an electroplating method and a light induced plating (LIP) method, etc., may be used.

Accordingly, a solution (for example, potassium dicyanoargentate ($KAg(CN)_2$)) containing corresponding metal ions (for example, Ag ions) is deposited into the second emitter region 1212 exposed through the plurality of first and second openings 181 and 182 to perform the plating process.

As shown in (a) of FIG. 10, when the plating process is performed, the metal plating process is performed on the second emitter region 1212 positioned inside the first and second openings 181 and 182 to grow the desired metal of the second emitter region 1212. Hence, the front electrode part 140 including the front electrodes 141 and the front bus bars 142 start to be formed and then is gradually grown to the outside of the first and second openings 181 and 182.

As described above, the plating growth of the metal for forming the front electrode part 140 is the isotropic growth performed at the same speed in the vertical and horizontal directions. As shown in (b) of FIG. 10, when the front electrodes 141 and the front bus bars 142 plating-grown inside the first and second openings 181 and 182 are grown up to the upper surface of the anti-reflection layer 130, the front electrodes 141 and the front bus bars 142 are grown on the anti-reflection layer 130 adjacent to the first and second openings 181 and 182 because the plating growth is carried out in the horizontal direction as well as the vertical direction.

Accordingly, the upper surface of each front electrode 141 and the upper surface of each front bus bar 142 have the curved surface.

In the embodiment of the invention, the plurality of second openings 182 are positioned adjacent to one another so as to form one front bus bar 142. As shown in (c) of FIG. 10, the metal portions (i.e., a portion of the front bus bar 142) grown in the two adjacent second openings 182 among the plurality of second openings 182 meet each other on the anti-reflection layer 130.

Although the metal plating growth is carried out in each of the separated second openings 182, the distance D11 between the two adjacent second openings 182 is within the range of the metal plating growth in the horizontal direction. Therefore, the metal portions grown in the two adjacent second openings 182 meet each other on the anti-reflection layer 130 positioned between the two adjacent second openings 182, and thus, form one front bus bar 142.

Accordingly, the width (i.e., the width of the lower surface of each front bus bar 142 contacting the anti-reflection layer 130 and the second emitter region 1212) of each of the finally formed front bus bars 142 is greater than a width D21 of the front bus bar formation area AB.

As described above, because the metal plating growth is the isotropic growth, a plated portion of each front bus bar 142 positioned in each second opening 182, i.e., the upper surface of each front bus bar 142 has the curved shape. Further, because the metal plating growth is carried out in each of the two adjacent second openings 182, the metal plating portions overlap each other on the anti-reflection layer 130 positioned between the two adjacent second openings 182. Therefore, a height of an upper surface of the overlap portion of the plating growth metal portions is less than a height of an upper surface of the plating growth metal portion on the second emitter region 1212 exposed through the second opening 182.

Accordingly, the upper surface of each front bus bar 142 formed on the anti-reflection layer 130 and on the second emitter region 1212 exposed through the second opening 182 is an uneven surface (i.e., a curved surface) having a plurality of protrusions and a plurality of depressions. As described above, the height of the upper surface of the front bus bar 142 positioned on the second emitter region 1212 exposed through the second opening 182 is greater than the height of the upper surface of the front bus bar 142 positioned on the height the anti-reflection layer 130.

Hence, a roughness of the upper surface of each front bus bar 142 increases, and a contact area between each front bus bar 142 and the conductive film increases. As a result, an amount of carriers moving from the front bus bars 142 to the conductive film increases.

In the embodiment of the invention, each of the front electrodes 141 and each of the front bus bars 142 of the front electrode part 140 formed using the plating method have a single-layered structure formed of metal such as silver (Ag). Alternatively, they may each have a multi-layered structure, for example, a double-layered structure and a triple-layered structure.

When the front bus bar 142 has the single-layered structure formed of silver (Ag), a specific resistance of the front bus bar 142 may be about 1.6 uΩcm to 2.5 uΩcm. Because the front bus bar 142 is formed using the plating method, a density of the front bus bar 142 formed using the plating method is much greater than a density of a front bus bar formed through the screen printing method using a silver paste. Thus, the specific resistance of the front bus bar 142 formed using the plating method is much less than a specific resistance (about 6.7 uΩcm) of the front bus bar formed using the silver paste. Hence, the conductivity of the front bus bar 142 is greatly improved.

When each front electrode 141 and each front bus bar 142 have the double-layered structure, a lower layer of each of the front electrode 141 and the front bus bar 142 contacting the emitter region 121 may be formed of nickel (Ni) and an upper layer positioned on the lower layer may be formed of silver (Ag). When each front electrode 141 and each front bus bar 142 have the triple-layered structure, a lower layer of each of the front electrode 141 and the front bus bar 142 contacting the emitter region 121 may be formed of nickel (Ni), a middle layer positioned on the lower layer may be formed of copper (Cu), and an upper layer positioned on the middle layer may be formed of silver (Ag) or tin (Sn).

The lower layer of each of the front electrode 141 and the front bus bar 142 is to improve adhesive characteristics by reducing a contact resistance between the lower layer and the second emitter region 1212 contacting the lower layer. The middle layer is to reduce the cost, and thus, may be formed of a relatively inexpensive material with the good conductivity, for example, copper (Cu). When the middle layer is formed of copper (Cu), the lower layer underlying the middle layer prevents copper (Cu), which may easily and stably couple with silicon (Si), from being penetrated (or absorbed) in the second emitter region 1212 formed of silicon (Si). Namely, the lower layer prevents copper (Cu) from serving as impurities blocking the movement of carriers.

Further, the upper layer is to prevent the oxidation of the lower layer or the middle layer underlying the upper layer, and to improve an adhesive strength between the conductive tape positioned on the upper layer and the front electrode part.

As described above, when the front electrode part 140 has the multi-layered structure, the plurality of layers of the front electrode part 140 are sequentially formed using the plating method with a desired thickness.

Because the front electrodes 141 and the front bus bars 142 are simultaneously formed through the same plating process, the front electrodes 141 and the front bus bars 142 have the same layer structure and the same material.

Referring back to FIG. 6F, and as shown in FIG. 6F, the silver-containing paste is printed using the screen printing method and then is dried to locally form a back bus bar pattern 52 on the back surface of the substrate 110 at a location corresponding to the front bus bar 142. Further, aluminum (Al), Al—Ag, or the silver-containing paste is printed on the back surface of the substrate 110, on which the back bus bar pattern 52 is not formed, using the screen printing method, and then is dried to locally form a back electrode pattern 51 on the back surface of the substrate 110. Hence, a back electrode part pattern 50 including the back electrode pattern 51 and the back bus bar pattern 52 is completed.

The back electrode pattern 51 is positioned on a portion of the back bus bar pattern 52 adjacent to the back electrode pattern 51 and may overlap the portion of the back bus bar pattern 52. The back electrode pattern 51 may not be formed at an edge of the back surface of the substrate 110.

When the substrate 110 is of the p-type, the back electrode pattern 51 may be formed using an aluminum-containing paste. Alternatively, when the substrate 110 is of the n-type, the back electrode pattern 51 may be formed using a paste containing Al—Ag or a silver-containing paste.

A drying temperature of the patterns 51 and 52 may be about 120° C. to 200° C., and formation order of the patterns 51 and 52 may vary, if desired.

Next, a thermal process is performed on the substrate 110, on which the back electrode part pattern 50 is formed, at a temperature of about 750° C. to 800° C.

Hence, a back electrode part 150 including a back electrode 151 electrically connected to the substrate 110 and a plurality of back bus bars 152 connected to the substrate 110 and the back electrode 151, and a plurality of surface field regions 172, which contact the back electrode 151 and are positioned at the back surface of the substrate 110, are formed (refer to FIGS. 1 and 2).

The back electrode pattern 51 and the back bus bar pattern 52 of the back electrode part pattern 50 chemically couple with the substrate 110 due to the thermal process of the substrate 110, and thus, become the back electrode 151 and the back bus bars 152. In this instance, because the back electrode pattern 51 chemically couples with the back bus bar pattern 52 due to the thermal process of the substrate 110, the electrical connection between the back electrode 151 and the back bus bar 152 is carried out.

During the thermal process, aluminum or silver contained in the back electrode pattern 51 is diffused into the substrate 110 to form the surface field regions 172 having an impurity doping concentration higher than the substrate 110 at the back surface of the substrate 110. Hence, the back electrode 151 contacts the surface field regions 172 having the conductivity greater than the substrate 110 and is electrically connected to the substrate 110. As a result, the collection of carriers from the substrate 110 is more easily carrier out.

In the embodiment of the invention, because the emitter region 121 is formed only at the front surface of the substrate 110, an edge isolation process for isolating the electrical connection of an emitter region formed at the back surface of the substrate 110 or a separate process for removing the emitter region formed at the back surface of the substrate 110 is not necessary. Thus, manufacturing time and manufacturing cost of the solar cell are reduced, and the productivity of the solar cell is improved.

In the embodiment of the invention, after the front electrode part 140 including the front electrodes 141 and the front bus bars 142 is formed, the back electrode part 150 including the back electrode 151 and the back bus bars 152 is formed. On the contrary, after the back electrode part 150 is formed, the front electrode part 140 may be formed.

As described above, because the front electrodes 141 are formed using the plating method, the width of each front electrode 141 formed using the plating method is less than the width of each front electrode formed using the screen printing method. Hence, the incidence area of the solar cell increases. As a result, the efficiency of the solar cell is improved.

Unlike the embodiment of the invention, when the emitter region 121 does not have the selective emitter structure, namely, the emitter region 121 has the same sheet resistance irrespective of its location so that a sheet resistance of the emitter region 121 underlying the front electrode part 140 is substantially equal to a sheet resistance of the emitter region 121 underlying the anti-reflection layer 130, the process illustrated in FIG. 6C is omitted in the above-described manufacturing processes of the solar cell.

Accordingly, immediately after the anti-reflection layer 130 is formed on the emitter layer 120, the laser beam is directly irradiated onto the anti-reflection layer 130 to form the plurality of first and second openings 181 and 182 in the anti-reflection layer 130.

In this instance, a separate impurity layer capable of additionally injecting impurities of the second conductive type into the emitter layer 120 does not exist on and under the anti-reflection layer 130. Further, the irradiation of the laser beam is not to additionally dope the impurities of the second conductive type but to remove only a desired portion of the anti-reflection layer 130. Therefore, an extra impurity doping process is not performed on an irradiation portion of the emitter layer 120, onto which the laser beam is irradiated.

Accordingly, an irradiation portion and a non-irradiation portion of the emitter layer 120 may have the same impurity doping concentration and the same sheet resistance.

Because the irradiation reason of the laser beam is different from the description with reference to FIG. 6D, a wavelength of the laser beam used may be about 355 nm. Further, power (about 5 W to 20 W) and irradiation time of the laser beam used may be determined depending on the material or the thickness of the anti-reflection layer 130.

In this instance, because processes for forming and removing the impurity layer 20 are omitted, manufacturing time and manufacturing cost of the solar cell are reduced.

In the embodiment of the invention, the back electrode 151 is formed using a paste containing aluminum (Al) or silver (Ag) through the screen printing method, and the back bus bars 152 are formed using a paste containing silver (Ag) through the screen printing method.

In an alternative example, the back electrode 151 and the back bus bars 152 may be formed using the plating method in the same manner as the front electrodes 141 and the front bus bars 142. In this instance, the back electrode 151 and the back bus bars 152 may be simultaneously formed using the same material through the same plating method in the same manner as the front electrodes 141 and the front bus bars 142. In addition, the back electrode 151 and the back bus bars 152 may be formed simultaneously with the front electrodes 141 and the front bus bars 142 through the plating process for the front electrodes 141 and the front bus bars 142. In this instance, the back electrode part 150 may be formed using the same material as the front electrode part 140. Further, the back electrode part 150 may have a single-layered structure or a multi-layered structure such as a double-layered structure and a triple-layered structure.

As described above, when the back electrode 151 and the back bus bars 152 are formed using the plating method and have a double-layered structure or a triple-layered structure, and a lower layer of the double-layered structure or the triple-layered structure contacting the surface field region 172 (i.e., a region of the substrate 110 which is heavily doped with impurities of the first conductive type) is formed of nickel (Ni), nickel silicide exists between the lower layer and the surface field region 172 due to the coupling between nickel (Ni) and silicon (Si) of the surface field region 172.

Further, a glass fit containing at least one of lead (Pb)-based material such as PbO, bismuth (Bi)-based material such as $Bi_2O_3$, aluminum (Al)-based material such as $Al_2O_3$, boron (B)-based material such as $B_2O_3$, tin (Sn)-based material, zinc (Zn)-based material such as ZnO, titanium (Ti)-based material such as TiO, and phosphorus (P)-based material such as $P_2O_5$ is not detected between the back electrode part 150 including the back electrode 151 and the back bus bars 152 and the surface field region 172.

In embodiments of the invention, due to the crossing of the front bus bar 142 and front electrodes 141, the front bus bar 142 itself has a structure in which a first portion is formed on a surface of the anti-reflection layer 130 in a sheet form, and a second portion formed through the anti-reflection layer 130 in a lattice form.

The solar cell according to the embodiment of the invention has the structure, in which light is incident on one (the front surface in the embodiment of the invention) of the front surface and the back surface of the substrate 110. Alternatively, as shown in FIG. 11, the solar cell according to the embodiment of the invention may be applied to a bifacial solar cell, in which light is incident on both the front surface and the back surface of the substrate 110.

When after the plurality of first and second openings 181 and 182 are formed in the anti-reflection layer 130 to expose a portion of the emitter region 121, the plating process is performed on the exposed portion of the emitter region 121 to form the front electrode part 140, the plurality of second openings 182 are used to form each front bus bar 142 of the bifacial solar cell in the same manner as the above-described solar cell, except crossings of the plurality of first and second openings 181 and 182. Further, the structure may be applied to the formation of the back electrode part 150 of the bifacial solar cell.

The bifacial solar cell is described with reference to FIG. 11.

Figure 11:
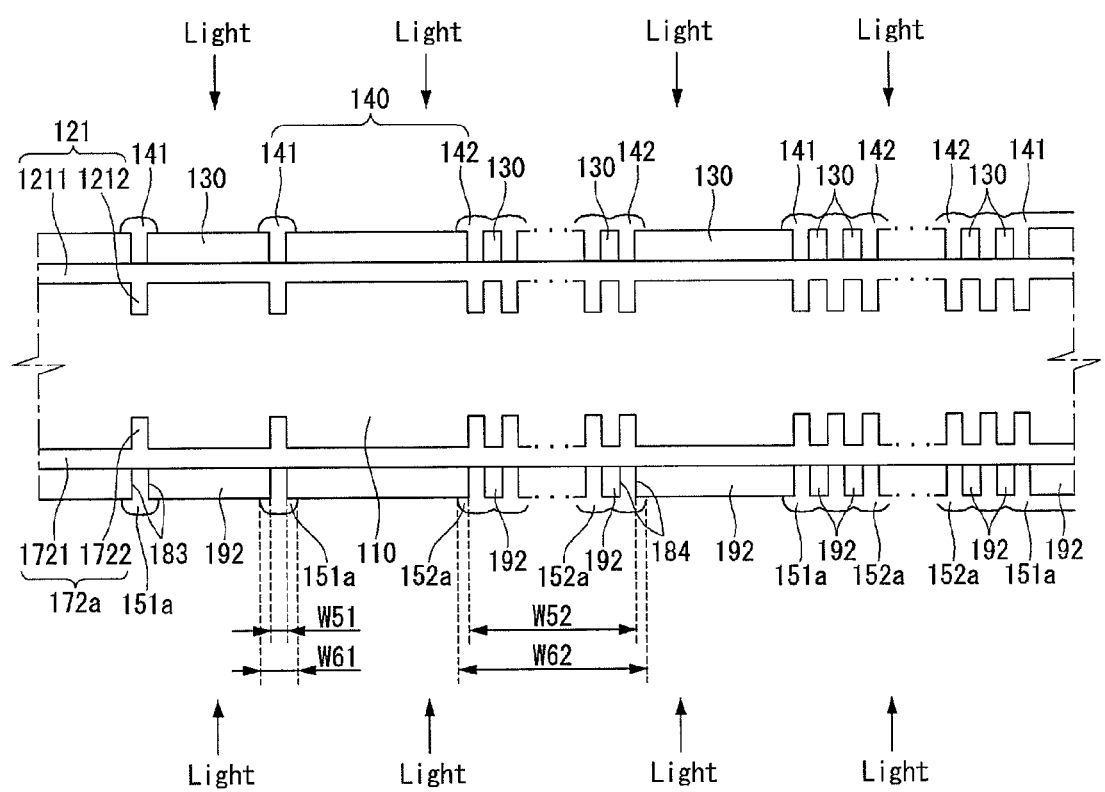
FIG. 11 is a partial cross-sectional view of a solar cell according to another example embodiment of the invention.

FIG. 11 illustrates a bifacial solar cell having the configuration of the solar cell shown in FIG. 2. Structures and components identical or equivalent to those described in the solar cell shown in FIGS. 1 and 2 are designated with the same reference numerals in the bifacial solar cell shown in FIG. 11, and a further description may be briefly made or may be entirely omitted.

As shown in FIG. 11, the bifacial solar cell includes a passivation layer 192 having a plurality of third and fourth openings 183 and 184 (or a plurality of first and second openings) on a back surface of a substrate 110, and a surface field region 172a which is positioned at the back surface of the substrate 110 underlying the passivation layer 192 and is more heavily doped than the substrate 110 with impurities of the same conductive type as the substrate 110. A first portion of the surface field region 172a is exposed through the plurality of third openings 183, and a second portion of the surface field region 172a is exposed through the plurality of fourth openings 184.

The surface field region 172a has a structure similar to a selective emitter structure. Thus, the surface field region 172a includes first and second field regions (or first and second impurity regions) 1721 and 1722 each having a different impurity doping concentration and a different sheet resistance depending on its location. For example, an impurity doping concentration of the second field region 1722 is higher than an impurity doping concentration of the first field region 1721, and a sheet resistance of the second field region 1722 is less than a sheet resistance of the first field region 1721. The second field region 1722 of the surface field region 172a is a portion of the surface field region 172a exposed through the plurality of third and fourth openings 183 and 184 and corresponds to the first and second portions of the surface field region 172a. The first field region 1721 of the surface field region 172a is a portion of the surface field region 172a underlying the passivation layer 192.

Similar to an anti-reflection layer 130, the passivation layer 192 performs a passivation function, which converts a defect, for example, dangling bonds existing at and around the back surface of the substrate 110 into stable bonds. Further, the passivation layer 192 serves as a reflection layer which reflects light passing through the substrate 110 to the substrate 110. The passivation layer 192 may be formed of hydrogenated silicon nitride (SiNx:H) or aluminum oxide ($Al_2O_3$), etc.

Similar to a front electrode part 140, a back electrode part 150a includes a plurality of back electrodes 151a, which are separated from one another, and a plurality of back bus bars 152a, which are separated from one another and are connected to the plurality of back electrodes 151a.

Each of the back electrodes 151a extends in the same direction as each front electrode 141, and each of the back bus bars 152a extends in the same direction as each front bus bar 142. Thus, each back bus bar 152a is connected to the plurality of back electrodes 151a at crossings of each back bus bar 152a and the plurality of back electrodes 151a. In embodiments of the invention, all, some or none of the front electrodes 141 may be aligned with those of the back electrodes 151a, and all, some or none of the front bus bars 142 may be aligned with those of the back bus bars 152a.

Each of the third openings 183 is used to form each back electrode 151a, and the plurality of fourth openings 184 are used to form each back bus bar 152a.

Accordingly, because the back electrodes 151a and the back bus bars 152a contact the second field region 1722 having the impurity doping concentration higher than the first field region 1721, a transfer efficiency of carriers moving from the substrate 110 to the back electrodes 151a and the back bus bars 152a is improved.

In the embodiment of the invention, one third opening 183 is used to form each back electrode 151a similar to each front electrode 141, and the plurality of fourth openings 184, for example, the 30 to 70 fourth openings 184 may be used to form each back bus bar 152a similar to each front bus bar 142. A ratio of a formation width of the plurality of second field regions 1722 corresponding to one back bus bar 152a or a back bus bar formation area (or a second bus bar formation area) of the surface field region 172a to a total width of the fourth openings 184 underlying one back bus bar 152a may be about 1:0.2 to 1:0.5.

Descriptions of a width of the third opening 183 for each back electrode 151a, a width of the fourth opening 184 for each back bus bar 152a, and a distance between the two adjacent fourth openings 184 among the plurality of fourth openings 184 for one back bus bar 152a are substantially the same as the descriptions based on the first and second openings 181 and 182.

Accordingly, when the plurality of fourth openings 184 are separated from one another at different distances therebetween in one back bus bar formation area, a distance between the two adjacent fourth openings 184 positioned in the middle of one back bus bar formation area or one back bus bar 152a may be about 1.5 times to 5 times a distance between the two adjacent fourth openings 182 positioned at an edge of one back bus bar formation area or one back bus bar 152a.

Because the second field regions 1722 are locally formed in the surface field region 172a exposed through the third and fourth 183 and 184, the width of each of the third and fourth 183 and 184 formed in the passivation layer 192 may be substantially equal to a width of the second field region 1722.

Hence, each back electrode 151a is formed on the second field region 1722 exposed through the one corresponding third opening 183 using the plating method. Further, each back bus bar 152a is formed on the second field region 1722 exposed through the plurality of corresponding fourth openings 184 using the plating method.

As described above, a plating growth is an isotropic growth performed at the same speed in both the vertical and horizontal directions.

Accordingly, each back electrode 151a is positioned on the first portion of the surface field region 172a exposed through each third opening 183 and on the passivation layer 192 adjacent to each third opening 183 and has a width W61 greater than a width W51 of each third opening 183. Further, each back bus bar 152a is positioned on the second portion of the surface field region 172a exposed through the plurality of fourth openings 184 and on the passivation layer 192 adjacent to the fourth openings 184 and also is positioned (or overlaps) on the passivation layer 192 between the two adjacent fourth openings 184. Hence, a width W62 of each back bus bar 152a is greater than a width W52 of the passivation layer 192, in which the plurality of fourth openings 184 for each back bus bar 152a are formed. A height of an upper surface (i.e., a surface opposite a surface of the back bus bar 152a contacting the surface field region 172a or the passivation layer 192) of the back bus bar 152a positioned in an overlap portion may be less than a height of an upper surface of the back bus bar 152a positioned on the second portion of the surface field region 172a exposed through the fourth opening 184. In this instance, the number of back electrodes 151a may be equal to or more than the number of front electrodes 141.

As described above, when the back electrodes 151a and the back bus bars 152a are formed using the plating method and have a double-layered structure or a triple-layered structure, and a lower layer of the double-layered structure or the triple-layered structure contacting the surface field region 172a (i.e., a region of the substrate 110 which is heavily doped with impurities of the first conductive type) is formed of nickel (Ni), nickel silicide exists between the lower layer and the surface field region 172a due to the coupling between nickel (Ni) and silicon (Si) of the surface field region 172a.

In the embodiment of the invention, a glass fit containing at least one of lead (Pb)-based material such as PbO, bismuth (Bi)-based material such as $Bi_2O_3$, aluminum (Al)-based material such as $Al_2O_3$, boron (B)-based material such as $B_2O_3$, tin (Sn)-based material, zinc (Zn)-based material such as ZnO, titanium (Ti)-based material such as TiO, and phosphorus (P)-based material such as $P_2O_5$ is not detected between the back electrode part 150a including the back electrodes 151a and the back bus bars 152a and the surface field region 172a.

Similar to the emitter region 121, which has already described with reference to FIGS. 1 and 2, a surface field region having an uniform sheet resistance and an uniform impurity doping concentration irrespective of the location may be used instead of the surface field region 172a including the first and second field regions 1721 and 1722.

In the embodiment of the invention, a formation process of the surface field region 172a is substantially the same as the emitter region 121 except the material used, and a formation process of the back electrode part 150a is substantially the same as the front electrode part 140. Therefore, a further description may be briefly made or may be entirely omitted.

In embodiments of the invention, due to the crossing of the back bus bar 152a and back electrodes 151a, the back bus bar 152a has a structure in which a first portion is formed on a surface of the passivation layer 192 in a sheet form, and a second portion is formed through the passivation layer 192 in a lattice form.

In the bifacial solar cell, because light is incident on both the front surface and the back surface of the substrate 110, an amount of light incident on the substrate 110 increases. Hence, the efficiency of the bifacial solar cell is improved.

The embodiment of the invention has described the solar cell, in which the emitter region 121 and the surface field region 172 (or 172a) are formed of the same semiconductor (i.e., crystalline semiconductor) as the substrate 110 and form the homojunction along with the substrate 110. However, at least one of the front electrode part and the back electrode part according to the embodiment of the invention and its manufacturing method may be applied to at least one of a front electrode part and a back electrode part of a solar cell forming a heterojunction. In the solar cell forming the heterojunction, a substrate may be formed of a crystalline semiconductor such as single crystal silicon and polycrystalline silicon, and at least one of an emitter region and a surface field region may be formed of a noncrystalline semiconductor such as amorphous silicon.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
   a substrate of a first conductive type;
   an emitter region of a second conductive type opposite the first conductive type, which is positioned at the substrate, the emitter region including a plurality of first emitter regions having a first sheet resistance and a plurality of second emitter regions having a second sheet resistance less than the first sheet resistance;
   an anti-reflection layer including a plurality of first opening lines extending in a first direction and separated from one another in a second direction crossing the first direction, which is positioned on the emitter region and exposes the plurality of second emitter regions, and a plurality of second opening lines extending in the second direction, which expose the plurality of second emitter regions and are separated from one another in the first direction, each of the first and second opening lines having the same width;
   a plurality of first electrodes which are positioned on the plurality of second emitter regions exposed through the plurality of first opening lines and are connected to the plurality of second emitter regions, one first electrode of the plurality of first electrodes positioned on one first opening line of the plurality of first opening lines;
   a first bus bar including a plurality of lower portions formed through the plurality of second opening lines and connected to the plurality of second emitter regions, and an upper portion formed on the anti-reflection layer and connected to the plurality of lower portions and the plurality of first electrodes; and
   a second electrode which is positioned on the substrate and is connected to the substrate,
   wherein a portion of the anti-reflection layer is positioned between the first bus bar and the plurality of first emitter regions.

2. The solar cell of claim 1, wherein a number of the plurality of second opening lines is 30 to 70.

3. The solar cell of claim 1, wherein a ratio of a width of a bus bar formation area of the anti-reflection layer to a total width of the plurality of second opening lines underlying the first bus bar is about 1:0.2 to 1:0.5.

4. The solar cell of claim 1, wherein the plurality of second opening lines are separated from one another at uniform intervals.

5. The solar cell of claim 1, wherein the plurality of second opening lines are separated from one another at different intervals.

6. The solar cell of claim 5, wherein the anti-reflection layer includes a bus bar formation area, in which the plurality of second opening lines are formed,
   wherein the first bus bar is positioned in the bus bar formation area of the anti-reflection layer, and
   wherein a distance between two adjacent second opening lines positioned in a middle of the bus bar formation area is greater than a distance between two adjacent second opening lines positioned at an edge of the bus bar formation area.

7. The solar cell of claim 6, wherein the distance between the two adjacent second opening lines positioned in the middle of the bus bar formation area is about 1.5 times to 5 times the distance between the two adjacent second opening lines positioned at the edge of the bus bar formation area.

8. The solar cell of claim 3, wherein a distance between two adjacent second opening lines is about 15 μm to 30 μm.

9. The solar cell of claim 1, wherein a portion of the upper portion of the first bus bar is positioned on the anti-reflection layer positioned between the plurality of second opening lines.

10. The solar cell of claim 1, wherein an upper surface of the upper portion of the first bus bar is a curved surface.

11. The solar cell of claim 10, wherein a height of the first bus bar positioned on the anti-reflection layer is less than a height of the first bus bar positioned on the plurality of second opening lines.

12. The solar cell of claim 10, wherein a height of an edge of the first bus bar is greater than a height of a middle portion of the first bus bar.

13. The solar cell of claim 1, wherein a lateral surface of at least one of the first and second opening lines is an even surface.

14. The solar cell of claim 1, wherein a lateral surface of at least one of the first and second opening lines is an uneven surface.

15. The solar cell of claim 1, wherein the plurality of second emitter regions are positioned in the emitter region exposed through the plurality of first opening and the the plurality of second opening lines.

16. The solar cell of claim 15, wherein a width of each of the plurality of second emitter regions is substantially equal to a width of each of the plurality of first opening lines and a width of each of the plurality of second opening lines.

17. The solar cell of claim 15, wherein a width of each of the plurality of second emitter regions exposed through the plurality of first opening lines is less than a width of the first electrode.

18. The solar cell of claim 15, wherein the anti-reflection layer includes a bus bar formation area, in which the plurality of second opening lines are formed,
wherein the first bus bar is positioned in the bus bar formation area of the anti-reflection layer, and
wherein a width of the first bus bar is greater than a width of the bus bar formation area.

19. The solar cell of claim 1, further comprising a surface field region of the first conductive type, which is positioned at the substrate underlying the second electrode and is connected to the substrate.

20. The solar cell of claim 19, further comprising a passivation layer, which is positioned on the surface field region and includes an opening exposing a first portion of the surface field region,
wherein the second electrode is positioned on the first portion of the surface field region exposed through the third opening and is connected to the surface field region.

21. The solar cell of claim 20, wherein the passivation layer further includes a plurality of openings, which are positioned to be separated from a second portion of the surface field region different from the first portion of the surface field region,
wherein the solar cell further comprises a second bus bar, which is positioned on the second portion of the surface field region exposed through the plurality of openings and is connected to the second electrode.

22. The solar cell of claim 21, wherein a number of the plurality of openings is 30 to 70.

23. The solar cell of claim 21, wherein a ratio of a width of a bus bar formation area of the passivation layer to a total width of the plurality of fourth openings underlying the second bus bar is about 1:0.2 to 1:0.5.

24. The solar cell of claim 21, wherein the plurality of openings are separated from one another at different intervals.

25. The solar cell of claim 18, wherein the second bus bar is additionally positioned on the passivation layer between the plurality of openings.

* * * * *